(12) United States Patent
Iyama et al.

(10) Patent No.: US 6,458,285 B1
(45) Date of Patent: Oct. 1, 2002

(54) METHOD AND APPARATUS FOR FREQUENCY CONTROL OF PIEZOELECTRIC COMPONENTS

(75) Inventors: Kiyoshi Iyama, Himi; Hiroki Kitano, Takaoka; Tetsuo Tatsumi, Toyama, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/570,748

(22) Filed: May 13, 2000

(30) Foreign Application Priority Data

May 14, 1999 (JP) .............................. 11-134582
Feb. 9, 2000 (JP) ...................... 2000-031683

(51) Int. Cl.⁷ ............................................ B44C 1/22
(52) U.S. Cl. ........................ 216/66; 216/59; 216/41; 216/13; 216/45; 216/91; 204/19; 204/29; 204/8.11; 204/2.34; 156/345.24; 156/345.39
(58) Field of Search ............... 216/66; 204/192.34, 204/298.11

(56) References Cited

U.S. PATENT DOCUMENTS 4,454,639 A * 6/1984 Dworsky et al. ........... 29/25.35
4,758,863 A * 7/1988 Nikkel ........................ 355/40
4,820,897 A * 4/1989 Lefevre ................. 219/121.67
5,407,525 A * 4/1995 Michel et al. ............... 156/627
5,662,782 A * 9/1997 Gomi et al. ........... 204/192.34
5,670,919 A * 9/1997 Gamo ......................... 333/189
5,759,753 A * 6/1998 Namba et al. .............. 438/456
6,045,671 A * 2/2000 Wu et al. .............. 204/298.11

FOREIGN PATENT DOCUMENTS

JP          03-289807         12/1991

* cited by examiner

Primary Examiner—Randy Gulakowski
Assistant Examiner—Gentle E. Winter
(74) Attorney, Agent, or Firm—Keating & Bennett, LLP

(57) ABSTRACT

A frequency control apparatus including a shielding board that is provided with a window for exposing some or all of a plurality of electrodes disposed on a piezoelectric substrate, and a shutter for opening and closing the window. An aperture pattern board is provided between the shielding board and a piezoelectric resonator. On the aperture pattern board, combinations of apertures are provided which correspond to the A electrodes exposed through the window on the shielding board at one time. After measuring the frequencies for respective elements and measuring the variations from the target frequency, the suitable pattern of apertures is selected from the aperture pattern board according to the amount of variations, and then the frequency control is carried out only on the elements selected through the apertures.

40 Claims, 21 Drawing Sheets

METHOD AND APPARATUS FOR FREQUENCY CONTROL OF PIEZOELECTRIC COMPONENTS

BACKGROUND OF THE INVENTION

1. Field of the Invention

The present invention relates to a method and an apparatus for controlling the frequency of piezoelectric components. More specifically, the present invention relates to a method and an apparatus for controlling the frequency of piezoelectric components such as piezoelectric ceramic resonators, filters, discriminators, or traps, by removing portions of the electrodes disposed on a piezoelectric substrate, or by adding a frequency control substance on the electrodes.

2. Description of the Related Art

Recently, with piezoelectric components such as filters, there has been a growing need for frequencies having very high precision. Conventionally, the frequency has been controlled by the steps of forming electrodes having frequencies that are somewhat higher than the target or desired frequency on both sides of a piezoelectric substrate, and applying frequency control ink on the electrodes by screen printing or by spray coating to increase the mass thereof. However, in the method described above, concentration of the frequency is too low to improve precision because the quantities of ink applied may vary widely. In addition, in the case of screen printing, the conventional method has another disadvantage in that it may cause cracking of the piezoelectric substrate because this method is based upon contact operation and therefore, the object is subjected to a load.

Accordingly, the applicant of the present invention has proposed a method for carrying out a non-contact frequency control with very high precision (Japanese Unexamined Patent Publication No. 3-289807). According to this method, the marking of a predetermined pattern is carried out by the steps of dividing the pattern to be marked into regions defining a matrix, charging ink particles by applying voltages proportional to the positional information obtained from each region, and directing charged particles of ink to the object to be marked by deflecting them in the electrostatic field. Therefore, a predetermined amount of ink can be applied to a piezoelectric resonator without variations in mass thereof, and thus, frequency control can be carried out with high precision.

When manufacturing piezoelectric components, in order to achieve the economies of mass production, a number of elements are formed first as mother substrates in a first step, and then the mother substrates are cut into individual elements. However, these elements may have differing frequencies even within one mother substrate due to a variety of factors. In such a case, even if the electrically controlled marking method is used as an alternative to screen printing, or other such method, it is difficult to reduce variations of frequencies among individual elements within the mother substrate, though it is possible to reduce variations of frequencies among mother substrates. It is also possible to change the amount of ink to be applied to the elements within a mother substrate on an individual basis according to frequencies thereof, however, it requires longer time because ink must be applied on the element one by one.

SUMMARY OF THE INVENTION

To overcome the problems described above, preferred embodiments of the present invention provide a frequency control apparatus for piezoelectric components which controls variations in frequency among individual elements quickly and achieves the economies of mass production, when a plurality of elements are formed within or on a piezoelectric substrate.

The frequency control apparatus for piezoelectric components in accordance with a preferred embodiment of the present invention preferably includes a pattern board disposed on a piezoelectric substrate having a plurality of electrodes disposed thereon and provided with an aperture pattern for selectively exposing the electrodes, a shielding board disposed on the pattern board and provided with a window for selectively exposing aperture patterns on the pattern board, and an electrode removal device arranged to remove portions of the electrodes disposed on the piezoelectric substrate exposed through the aperture pattern on the pattern board and though the window on the shielding board.

In accordance with this preferred embodiment of the present invention, since the electrodes disposed on the piezoelectric substrate are exposed selectively through the aperture pattern on the pattern board and the aperture patterns are exposed selectively through the window on the shielding board, frequency is controlled by selectively exposing electrodes which require frequency control through the aperture pattern according to variations in frequency of respective elements including electrodes from the target frequency, and removing portions of those exposed electrodes.

In addition, in accordance with the present preferred embodiment of the present invention, frequencies of a plurality of electrodes are controlled simultaneously very efficiently by a group of electrodes exposed simultaneously through the window on the shielding board. By repeating frequency control procedures after changing the aperture pattern to be exposed through the window on the shielding board, very precise frequency control is achieved for a plurality of electrodes exposed through the window on the shielding board, and thus, frequencies of individual elements are controlled with high precision.

The frequency control apparatus for piezoelectric components in accordance with another preferred embodiment of the present invention includes a pattern board disposed on a piezoelectric substrate having a plurality of electrodes disposed on the surface thereof and provided with an aperture pattern for selectively exposing the electrodes, a shielding board disposed on the pattern board and provided with a window for selectively exposing an aperture pattern on the pattern board, and frequency control substance coating device arranged to apply a frequency control substance on the electrodes located on the piezoelectric substrate and exposed through the aperture pattern on the pattern board and though the window on the shielding board.

In accordance with the present preferred embodiment of the present invention, since the electrodes provided on the piezoelectric substrate are exposed selectively through the aperture pattern on the pattern board, and the aperture patterns are exposed selectively through the window on the shielding board, frequency may be controlled by selectively exposing electrodes which require frequency control through the aperture pattern according to variations from the target frequency of respective elements which include electrodes, and applying a frequency control substance only on those exposed electrodes.

In addition, in accordance with this preferred embodiment of the present invention, frequencies of a plurality of electrodes may be controlled simultaneously with efficiency by a group of electrodes exposed simultaneously through the window on the shielding board. By repeating frequency control procedures after changing the aperture pattern to be exposed through the window on the shielding board, very accurate frequency control is achieved for a plurality of electrodes exposed through the window on the shielding board. As a result, frequencies of individual elements are controlled with very high precision.

The frequency control apparatus for piezoelectric components in accordance another preferred embodiment of the present invention preferably includes a pattern board disposed on a plurality of piezoelectric substrates having electrodes provided on the surface thereof and provided with an aperture pattern for selectively exposing the electrodes located on a plurality of piezoelectric substrates, a shielding board disposed on the pattern board and provided with a window for selectively exposing aperture pattern on the pattern board, and an electrode removing device arranged to remove portions of the electrodes provided on the piezoelectric substrate and exposed through the aperture pattern on the pattern board and through the window on the shielding board.

In accordance with the present preferred embodiment of the present invention, since the electrodes located on a plurality of piezoelectric substrates can be exposed selectively through the aperture pattern on the pattern board and the aperture pattern can be exposed selectively through the window on the shielding board, frequency control is performed by selectively exposing electrodes which require frequency control through the aperture pattern according to variations in frequency of respective elements which include electrodes, from the target frequency and removing portions of those exposed electrodes.

In addition, in accordance with the present preferred embodiment of the present invention, frequencies of a plurality of piezoelectric substrates are controlled simultaneously very efficiently by a group of electrodes exposed simultaneously through the window on the shielding board. By repeating frequency control procedures after changing the aperture pattern to be exposed through the window on the shielding board, very accurate frequency control is achieved for a plurality of electrodes exposed through the window on the shielding board. As a result, frequencies of elements provided on respective piezoelectric substrates are controlled with very high precision.

The frequency control apparatus for piezoelectric components in accordance with another preferred embodiment of the present invention includes a pattern board disposed on a plurality of piezoelectric substrates having electrodes provided on the surface thereof and provided with an aperture pattern for selectively exposing the electrodes located on a plurality of piezoelectric substrates, a shielding board disposed on the pattern board and provided with a window for selectively exposing predetermined aperture pattern on the pattern board, and a frequency control substance coating device arranged to apply a frequency control substance on the electrodes disposed on the piezoelectric substrate and exposed through the aperture pattern on the pattern board and though the window on the shielding board.

In accordance with the present preferred embodiment of the present invention, since the electrodes located on a plurality of piezoelectric substrates are exposed selectively through the aperture pattern on the pattern board and the aperture patterns are exposed selectively through the window on the shielding board, frequency may be controlled by selectively exposing electrodes which need frequency control through the aperture pattern according to variations in frequency of respective elements including electrodes from the target frequency and applying frequency control substance only on those exposed electrodes.

In addition, in accordance with the present preferred embodiment of the present invention, frequencies of a plurality of piezoelectric substrates are controlled simultaneously and very efficiently by a group of electrodes exposed simultaneously through the window on the shielding board. By repeating frequency control procedures after changing the aperture pattern to be exposed through the window on the shielding board, highly accurate frequency control is achieved for a plurality of electrodes exposed through the window on the shielding board. As a result, frequencies of elements located on respective piezoelectric substrates are controlled with very high precision.

In accordance with another preferred embodiment of the present invention, the frequency control apparatus for piezoelectric components according to other preferred embodiments of the present invention are such that the electrodes are exposed selectively by combining aperture patterns on a plurality of pattern boards.

In accordance with the present preferred embodiment of the present invention, since the electrodes are exposed selectively by a combination of a plurality of pattern boards having aperture patterns thereon, the number of the aperture patterns on each pattern board can be reduced. The total number of aperture patterns on the pattern boards can also be reduced. As a result, the structure of the pattern board is greatly simplified, and the distance of movement of the pattern board can be shortened to achieve rapid control of the frequency.

In accordance with another preferred embodiment of the present invention, the frequency control apparatus for piezoelectric components according to other preferred embodiments described above further includes a shutter for opening and closing the window on the shielding board.

In accordance with this preferred embodiment of the present invention, since the frequency control apparatus for piezoelectric components is provided with a shutter for opening and closing the window on the shielding board, the amount of removal of electrodes or the amount of application of frequency control substance on the electrodes is controlled by controlling the duration of opening and closing of the window, and the frequency of elements is controlled with very high precision.

In accordance with another preferred embodiment of the present invention, the frequency control apparatus for piezoelectric components according to the preferred embodiments of the present invention described above is arranged to linearly move the pattern boards.

In accordance with the present preferred embodiment of the present invention, since the pattern board of the frequency control apparatus for piezoelectric components is linearly moved, the waste region in the pattern boards (waste region between aperture patterns) is reduced in comparison with the apparatus of the type wherein the pattern board is rotatably moved, and the pattern boards can be used effectively with greatly decreased size.

In accordance with another preferred embodiment of the present invention, the frequency control apparatus for piezoelectric components according to the preferred embodiments of the present invention above is arranged to rotationally move the pattern board.

In accordance with the present preferred embodiment of the present invention, since the pattern board is rotationally moved, the aperture pattern board can be moved by, for example, a motor or other suitable mechanism. As a result, the driving system of the pattern board is simplified in comparison with the apparatus of the type wherein the pattern board is moved linearly.

A method for controlling the frequency of a piezoelectric component in accordance with another preferred embodiment of the present invention preferably includes the steps of providing a piezoelectric substrate having a plurality of electrodes provided on the surface thereof, disposing a pattern board having an aperture pattern for selectively exposing electrodes disposed on a piezoelectric substrate, disposing a shielding board having a window for selectively exposing a predetermined aperture patterns on the pattern board, and removing portions of the electrodes disposed on the piezoelectric substrate exposed through the aperture pattern on the pattern board and through the window on the shielding board.

In accordance with another preferred embodiment of the present invention, since the electrodes disposed on a piezoelectric substrate are exposed selectively through the aperture pattern on the pattern board and the aperture patterns are exposed selectively through the window on the shielding board, frequency may be controlled by selectively exposing electrodes which need frequency control through the aperture pattern according to variations in frequency of respective elements which include electrodes, from the target frequency and removing portions of the exposed electrodes.

In addition, in accordance with the present preferred embodiment of the present invention, frequencies of a plurality of electrodes are controlled at the same time with efficiency by a group of electrodes exposed simultaneously through the window on the shielding board. By repeating frequency control procedures after changing the aperture pattern to be exposed through the window on the shielding board, very accurate frequency control is achieved for a plurality of electrodes exposed through the window on the shielding board. As a result, frequencies of individual elements are controlled with very high precision.

A method for controlling the frequency of a piezoelectric component in accordance with another preferred embodiment of the present invention preferably includes the steps of providing a piezoelectric substrate having a plurality of electrodes formed on the surface thereof, disposing a pattern board having an aperture pattern for selectively exposing electrodes formed on the piezoelectric substrate, disposing a shielding board having a window for selectively exposing aperture patterns of the pattern board, and applying a frequency control substance on the electrodes disposed on the piezoelectric substrate and exposed through the aperture pattern of the pattern board and through the window on the shielding board.

In accordance with the present preferred embodiment of the present invention, since the electrodes disposed on the piezoelectric substrate are exposed selectively through the aperture pattern on the pattern board and the aperture patterns are exposed selectively through the window on the shielding board, frequency may be controlled by selectively exposing electrodes which require frequency control through the aperture pattern according to variations in frequency of respective elements which include electrodes, from the target frequency and applying a frequency control substance only to those exposed electrodes.

In addition, in accordance with the present preferred embodiment of the present invention, frequencies of a plurality of electrodes are controlled simultaneously and efficiently by a group of electrodes exposed simultaneously through the window on the shielding board. By repeating frequency control procedures after changing the aperture pattern to be exposed through the window on the shielding board, very accurate frequency control is achieved for a plurality of electrodes exposed through the window on the shielding board. As a result, frequencies of individual elements are controlled with very high precision.

A method for controlling the frequency of a piezoelectric component in accordance with another preferred embodiment of the present invention includes the steps of providing a plurality of piezoelectric substrates having electrodes formed on the surface thereof, disposing a pattern board having an aperture pattern for selectively exposing electrodes formed on a plurality of piezoelectric substrates, disposing a shielding board having a window for selectively exposing aperture patterns of the pattern board, and removing portions of the electrodes formed on the piezoelectric substrate and exposed through the aperture pattern of the pattern board and through the window on the shielding board.

In accordance with the present preferred embodiment of the present invention, since the electrodes disposed on a plurality of piezoelectric substrates are exposed selectively through the aperture pattern on the pattern board and the aperture patterns are exposed selectively through the window on the shielding board, frequencies may be controlled by selectively exposing electrodes which require frequency control through the aperture pattern according to variations in frequencies of respective elements which include electrodes, from the target frequency and removing portions of those exposed electrodes.

In addition, in accordance with the present preferred embodiment of the present invention, frequencies of a plurality of piezoelectric substrates are controlled simultaneously and efficiently by a group of electrodes exposed simultaneously through the window on the shielding board. By repeating frequency control procedures after changing the aperture pattern to be exposed through the window on the shielding board, very accurate frequency control can be achieved for a plurality of electrodes exposed through the window on the shielding board. As a result, frequencies of elements disposed on respective piezoelectric substrates are controlled with very high precision.

A method for controlling the frequency of a piezoelectric component in accordance with another preferred embodiment of the present invention preferably includes the steps of providing a plurality of piezoelectric substrates having electrodes formed on its surface, disposing a pattern board having an aperture pattern for selectively exposing electrodes disposed on a plurality of piezoelectric substrates, forming a shielding board having a window for selectively exposing a predetermined aperture patterns of the pattern board, and applying a frequency control substance on the electrodes formed on the piezoelectric substrate and exposed through the aperture pattern on the pattern board and through the window on the shielding board.

In accordance with the present preferred embodiment of the present invention, since the electrodes provided on a plurality of piezoelectric substrates are exposed selectively through the aperture pattern on the pattern board and the predetermined aperture patterns are exposed selectively through the window on the shielding board, frequency may be controlled by selectively exposing electrodes which need frequency control through the aperture pattern according to variations in frequency of respective elements which include electrodes, from the target frequency and applying a frequency control substance only to those exposed electrodes.

In addition, in accordance with the present preferred embodiment of the present invention, frequencies of a plurality of piezoelectric substrates are controlled simultaneously and efficiently by a group of electrodes exposed simultaneously through the window on the shielding board. By repeating frequency control procedures after changing the aperture pattern to be exposed through the window on the shielding board, very accurate frequency control is achieved for a plurality of electrodes exposed through the window on the shielding board. As a result, frequencies of electrodes formed on respective piezoelectric substrates are controlled with precision.

In accordance with another preferred embodiment of the present invention, in the method for controlling the frequency of a piezoelectric component according to the previously described preferred embodiments, the electrodes are exposed selectively by combining aperture patterns of a plurality of pattern boards.

In accordance with this preferred embodiment of the present invention, since the electrodes are exposed selectively by a combination of a plurality of pattern boards having aperture patterns thereon, the number of the aperture patterns on each pattern board can be reduced. The total number of aperture patterns on the pattern boards can also be reduced. As a result, the structure of the pattern board is greatly simplified, and the distance of movement of the pattern board can be shortened to achieve rapid control of the frequency.

In accordance with this preferred embodiment of the present invention, the method for controlling the frequency of a piezoelectric component according to previously described preferred embodiments of the present invention further includes the step of disposing a shutter for opening and closing the window of the shielding board.

In accordance with this preferred embodiment of the present invention, since the method for controlling frequency of a piezoelectric component includes a shutter for opening and closing the window on the shielding board, the amount of removal of electrodes or the amount of application of frequency control substance on the electrodes is accurately controlled by controlling the duration of opening and closing of the window, and the frequency of elements are therefore controlled with precision.

In accordance with another preferred embodiment of the present invention, the method for controlling frequency of a piezoelectric component according to previously described preferred embodiments of the present invention includes a step of linearly moving the pattern board.

In accordance with this preferred embodiment of the present invention, since the pattern board is linearly moved, the waste region in the pattern boards (waste region between aperture patterns) is greatly reduced in comparison with the apparatus of the type wherein the pattern board is rotationally moved, so that the pattern boards are used effectively to decrease the size of the pattern boards.

In accordance with another preferred embodiment of the present invention, the method for controlling the frequency of a piezoelectric component according to previously described preferred embodiments of the present invention includes the step of rotationally moving the pattern board.

In accordance with this preferred embodiment of the present invention, since the pattern board is rotationally moved, the aperture pattern board can be moved, for example, by a motor or other suitable mechanism, so that the driving system of the pattern board is simplified in comparison with the apparatus of the type wherein the pattern board is moved linearly.

In accordance with another preferred embodiment of the present invention, the method for controlling the frequency of a piezoelectric component according to previously described preferred embodiments, includes the steps of forming the electrodes on the piezoelectric substrate in a matrix, exposing these electrodes through the aperture pattern of the pattern board and through the window of the shielding board on a column-by-column basis, and removing portions of the electrodes or increasing in mass thereof so that the frequency of respective electrodes can be controlled on a column-by-column basis.

Since the present preferred of the present invention preferably includes the steps of forming the electrodes in a matrix and exposing through the aperture pattern on a column-by column basis to control the frequency of respective electrodes on a column-by-column basis, the frequency of electrodes arranged on the piezoelectric board is controlled on a column-by-column basis in orderly sequence.

In accordance with another preferred embodiment of the present invention, the method for controlling the frequency of a piezoelectric component according to previously described preferred embodiments of the present invention preferably includes the steps of arranging piezoelectric substrates having electrodes thereon in a matrix, exposing these electrodes though the aperture pattern on the aperture board and through the window on the shielding board on a column-by-column basis, and removing portions of the electrodes or increasing the mass thereof so that the frequency of respective electrodes are controlled on a column-by-column basis.

Since the method for controlling the frequency of a piezoelectric component according to this preferred embodiment of the present invention includes the steps of arranging the piezoelectric substrates having electrodes thereon in a matrix and exposing the electrodes on these piezoelectric substrates through the aperture pattern on a column-by column basis to control the frequency of respective electrodes on a column-by-column basis, the frequency of the piezoelectric boards having electrodes formed thereon may be controlled on a column-by-column basis in an orderly sequence.

Other features, elements, characteristics and advantages of the present invention will become more apparent with reference to preferred embodiments thereof which are described in detail below with reference to the attached drawings.

DETAILED DESCRIPTION OF PREFERRED EMBODIMENTS

Figure 1:
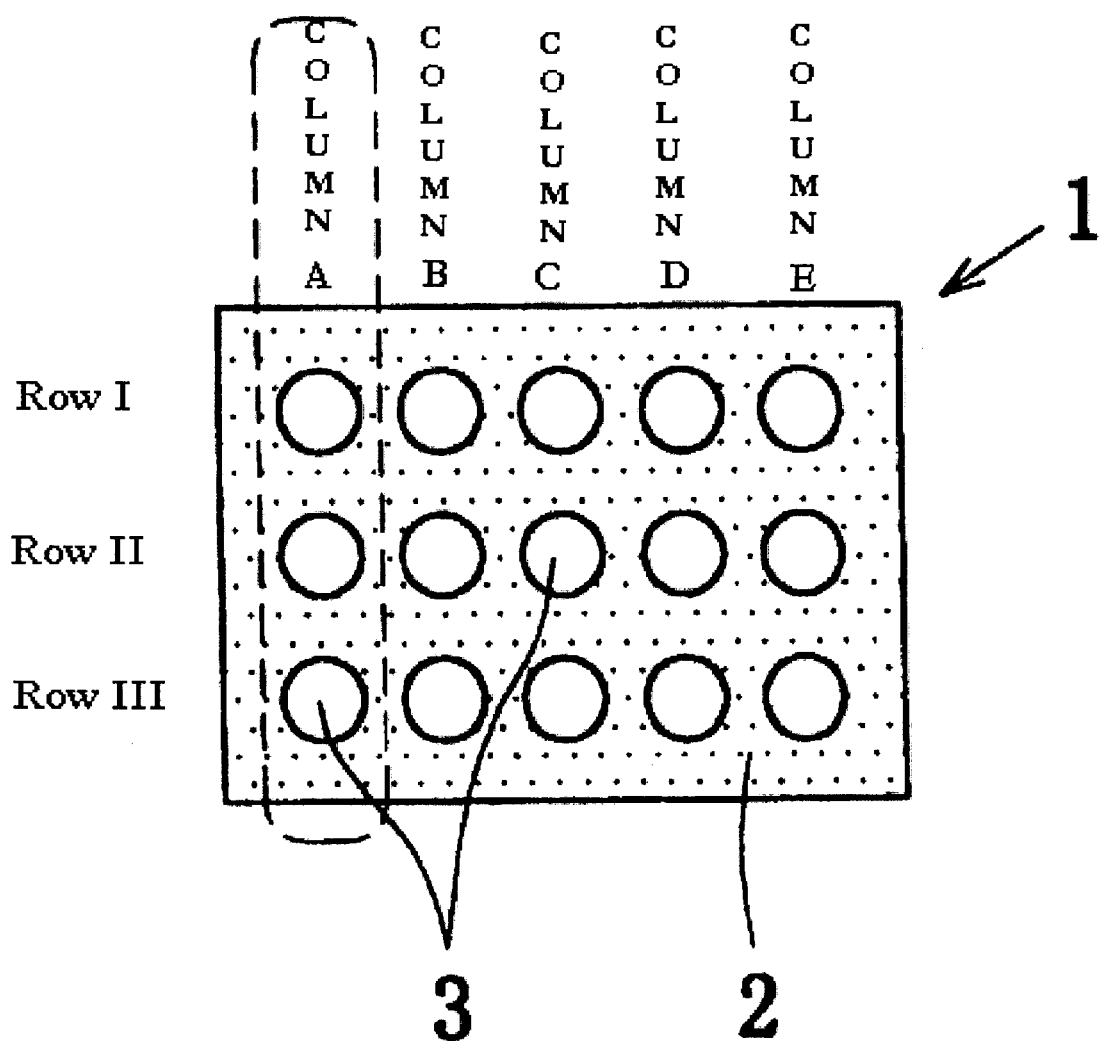
FIG. 1 is a plan view illustrating an example of a piezoelectric resonator.

A piezoelectric resonator 1 which is to undergo frequency control will now be described. FIG. 1 shows an example of a piezoelectric resonator 1 which is provided with a plurality of electrodes 3 arranged on front and back surfaces of a piezoelectric substrate (mother substrate) 2, respectively. FIG. 1 illustrates a configuration of the piezoelectric resonator 1 in the middle stage of manufacture including a plurality of elements. Each element of the piezoelectric resonator 1 includes electrodes 3 provided on both surfaces of the piezoelectric resonator 1 facing each other and the piezoelectric substrate 2 placed between the electrodes 3. For simplification, the description is directed to an example in which electrodes 3 are arranged in three rows (Row I to Row III) and five columns (Column A to Column E) systematically.

Figure 2:
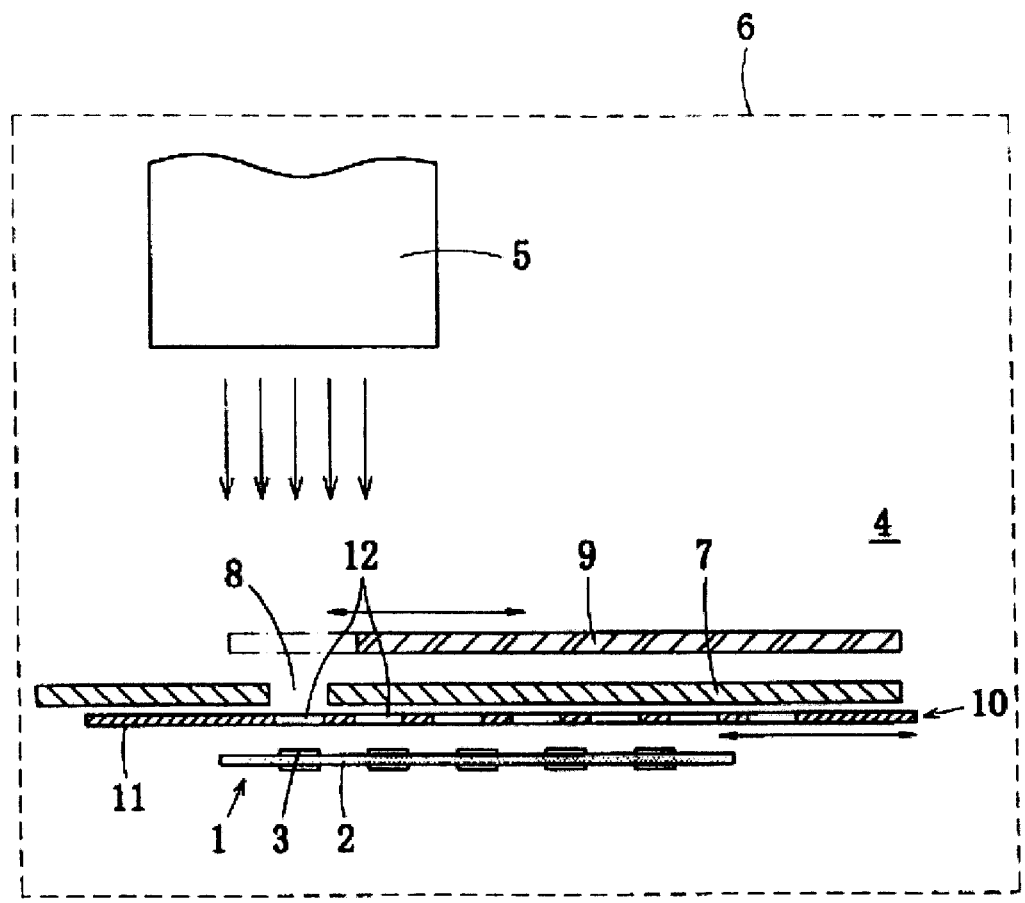
FIG. 2 is a cross-sectional view illustrating a structure of a frequency control apparatus according to a preferred embodiment of the present invention.

FIG. 2 is a cross sectional view showing a structure of a frequency control apparatus 4 for the piezoelectric resonator 1 according to an embodiment of the present invention. An ion beam irradiating portion of an ion beam irradiating apparatus 5 and the frequency control apparatus 4 are placed in a vacuum vessel 6. The frequency control apparatus 4 comprises a shielding board 7, a shutter 9, and an aperture pattern setting portion 10. The shielding board 7 is provided with a transversely elongated window 8 and is constructed in such a manner that only a column of electrodes 3 is exposed through the window 8 when the piezoelectric substrate 2 is covered by the shielding board 7. The shielding board 7 is fixed horizontally, and the window 8 is located immediately under the ion beam irradiating portion of the ion beam irradiating apparatus 5. The shutter 9 is provided in the proximity of the shielding board 7 on the upper side and is constructed so as to open and close the window 8 of the shielding board by horizontal sliding movement thereof and so as to control the timing of opening and closing with very high precision.

Figure 3:
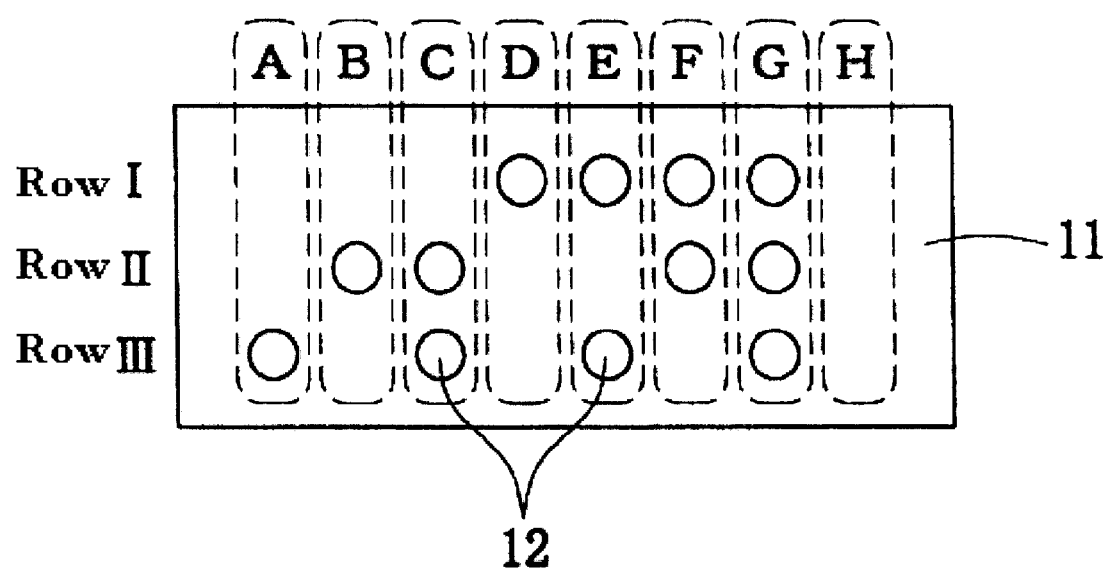
FIG. 3 is a plan view of the pattern board constituting the frequency control apparatus shown in FIG. 2.

In the proximity of the shielding board 7 on the lower side, there is provided a pattern board 11 of the aperture pattern setting portion 10 horizontally. On the pattern board 11, as shown in FIG. 3, a combination of openings 12 (hereinafter referred to as an aperture pattern) corresponding to the electrodes 3 arranged in three rows for one column are provided. In other words, the aperture pattern is a combination of apertures arranged to determine whether or not to provide openings at the positions corresponding to the electrodes 3 (in this preferred embodiment, a row of electrodes 3) which can be exposed at the same time through the window 8 of the shielding board 7. In the case of the piezoelectric resonator 1 of FIG. 1, since three electrodes 3 are provided in a column, there are $2^3=8$ possible aperture patterns, which is shown as Column A to Column H in FIG. 3. It is also possible to omit Column H which has no opening corresponding to any of electrodes 3.

The combination of aperture patterns, that is, from Column A to Column H, are arranged longitudinally relative to the pattern board 11 side by side, and the distance between each column (the distance between the centers of the openings) is longer than the width of the window 8. The diameter of the opening 12 is, considering the distribution of strength of the ion beam irradiated from the ion irradiating apparatus 5, somewhat larger than the diameter of the electrode 3. The pattern 11 is moved horizontally on the lower side of the shielding board 7 by a driver (not shown) including a motor such as a pulse step motor or a servo motor and a gear mechanism on a column basis from Column A to Column H.

On the lower side of the pattern board 11, the piezoelectric resonator 1 placed on the carrier tray (not shown) is seated. The piezoelectric resonator 1 is carried in the state placed on the carrier tray, and advanced under the pattern 11 by a distance that is substantially equal to the pitch of the columns of the electrodes 3 and registered so that only a column of electrodes 3 may be exposed through the window 8 formed on the shielding board 7.

Figure 4:
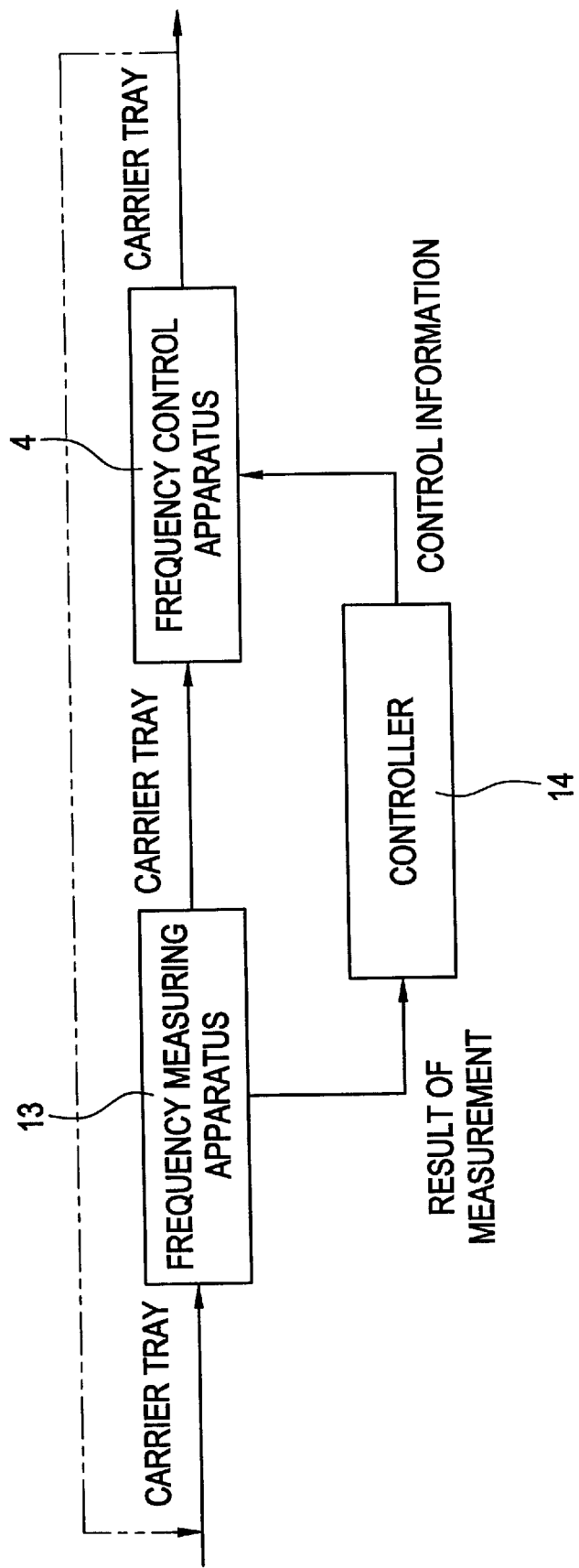
FIG. 4 is a diagrammatic explanatory illustration showing a process of measuring and controlling the frequency.

Next, the process of frequency control achieved by the frequency controlling apparatus 4 discussed above will be described. In this process of frequency control, as shown in FIG. 4, the frequency control apparatus 13 and the frequency control apparatus 14 are used to carry out the frequency control operation according to the following procedure.

Figure 5:
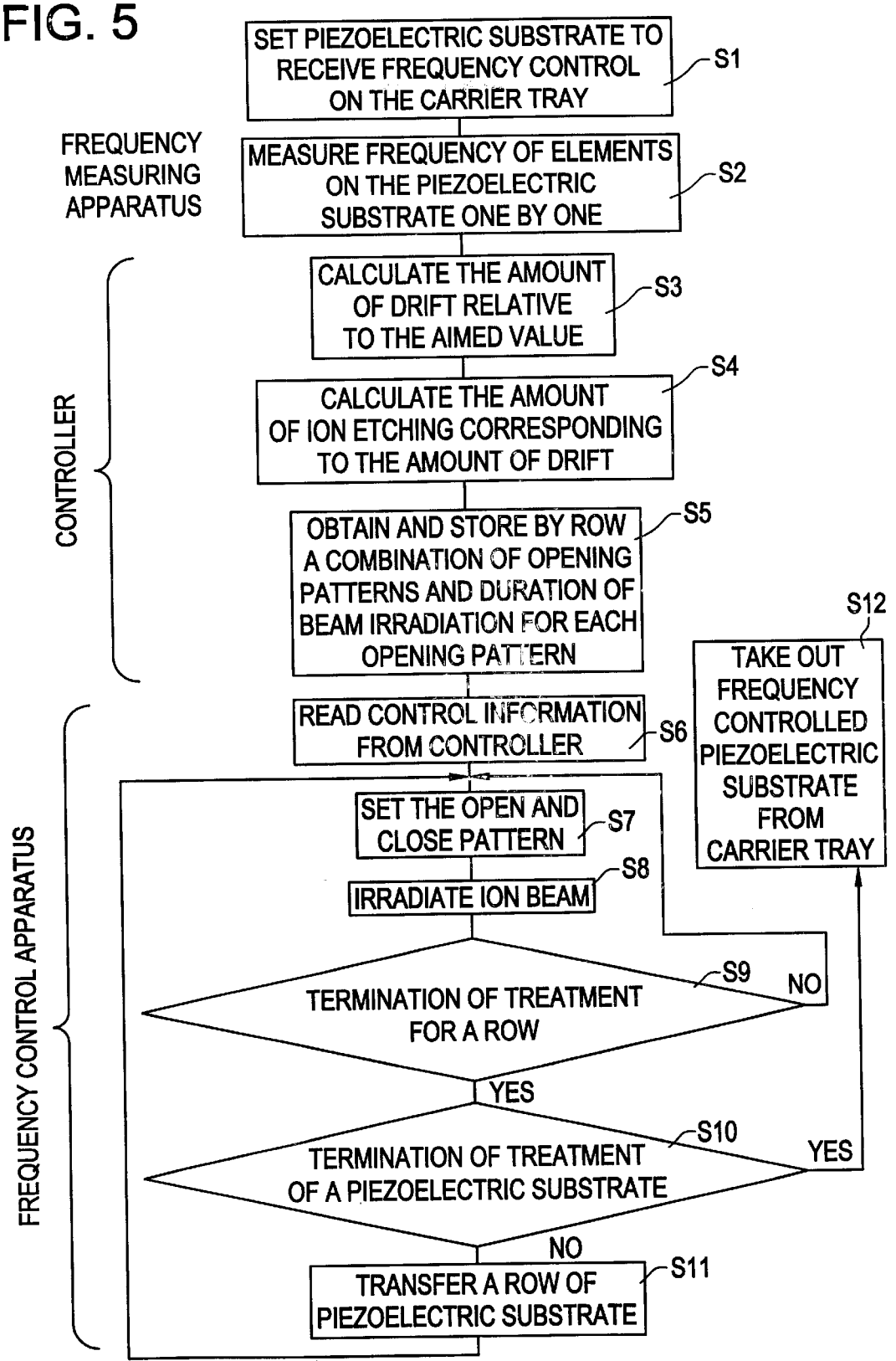
FIG. 5 is a flow chart showing procedures of frequency control in the process of FIG. 4.

FIG. 5 is a flow chart showing the procedures of the frequency controlling operation. On the both surfaces of the piezoelectric substrate 2, electrodes 3 having frequencies somewhat lower than the target frequency are formed. After pluralities of groups of electrodes are formed on both surfaces of the piezoelectric substrate 2, the piezoelectric substrate 2 to receive frequency control is set on the carrier tray (S1). On each carrier tray, there is provided an identification mark such as an identification number or an identification code. When the carrier tray with a piezoelectric substrate 2 set thereon is carried into the frequency measuring apparatus 13, the frequency measuring apparatus 13 measures frequencies of elements formed on the identical piezoelectric substrate 2 respectively (S2). When the measurement of frequency is completed, the frequency measuring apparatus 13 transmits the identification mark of the carrier tray and the measurements of respective elements to the controller 14.

When the controller 14 receives the identification mark of the carrier tray and the measurements of respective elements, it calculates the amount of drift between the measurement of the frequency of each element and the target frequency (S3), and then calculates the amount of ion etching (the duration of ion beam irradiation) according to the drift of frequency for each element (s4).

When the amounts of ion etching for respective elements are determined, the controller 14 finds a combination of aperture patterns A to H for the irradiating beam as much as the amount needed for ion etching of each electrodes 3 provided on the piezoelectric substrate 2 on a column-by-column basis, as well as the durations of ion beam irradiation for each aperture pattern A to H. The controller 14 then stores a combination of aperture patterns A to H for each column of electrodes and the durations of ion beam irradiation for each aperture pattern A to H together with the identification mark of the carrier tray (S5).

Figure 6:
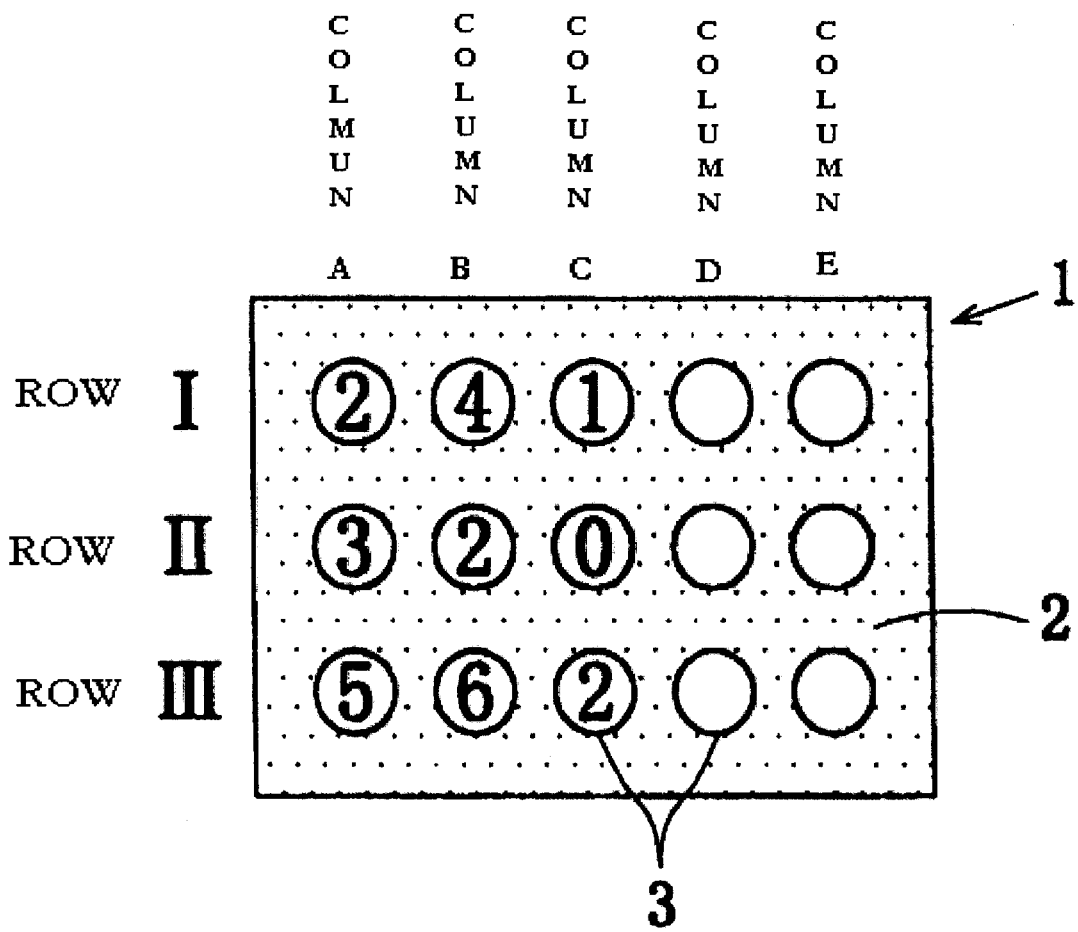
FIG. 6 is a view illustrating an example showing the duration of ion beam irradiation for each element formed on a piezoelectric substrate.

Assuming the result of measurements of frequencies for each element provided on the piezoelectric substrate 2 of FIG. 1, as shown in each electrode 3 in FIG. 6, is such that the duration of ion beam irradiation for each electrode is: 2 a.u. (a.u. is a optional unit), 3 a.u., 5 a.u. for Column A, 4 a.u., 2 a.u. and 6 a.u. for Column B. In such a case, for the electrodes 3 of Column A, the durations of ion beam irradiation would be 2 a.u. by using the aperture patterns A, 1 a.u. by using the aperture pattern C, and 2 a.u. by using the aperture pattern G. For the electrodes of Column B, the durations of ion beam irradiation would be 2 a.u. by using the aperture pattern A, 2 a.u. by using the aperture pattern E, and 2 a.u. by using the aperture pattern G. For the electrodes of Column C as well, the ion beam may be irradiated by using the aperture patterns for the electrodes in decreasing order of duration of ion beam irradiation.

While, upon completion of measurement of frequencies, the carrier tray carrying the piezoelectric substrate 2 is removed from the frequency measuring apparatus 13 and delivered to the frequency control apparatus 4. The frequency control apparatus 4 identifies the carrier tray by the identification mark, and reads out the corresponding control information (the combination of the aperture patterns A to H and the durations of ion beam irradiation using each aperture pattern A to H) from the controller 14 (S6).

Accordingly, when the electrodes of Column A is registered right under the window 8 of the shielding board 7, the aperture patterns corresponding to the electrodes of Column A are selected according to control information, the aperture pattern setting portion 10 is moved to urge the selected aperture pattern under the window 8 of the shielding board 7, and then the ion beam is irradiated for a prescribed duration for each aperture pattern by controlling the duration during which the shutter remains open (S7 to S9).

More specifically, when the electrodes of Column A are registered under the window 8, the aperture pattern A is set on the electrodes of Column A (S7) and the ion beam is irradiated for 2 a.u. (S8) as a first step, then the aperture pattern C is set on the electrodes 3 of Column A (S7) and the ion beam is irradiated for 1 a.u. (S8), and finally the aperture pattern G is set on the electrodes 3 of Column A (S7) and the ion beam is irradiated for 2 a.u. (S8). The aperture patterns A, C, and G may be used in arbitrary order, for example, a reverse order.

Accordingly, when the treatment for a column of electrodes 3 is finished (S9), the piezoelectric substrate 2 is moved by a pitch of the column of the electrodes (S11), and the next column of electrodes 3 are set under the window 8 (S7). Subsequently, the aperture patterns for that column of electrodes 3 are selected according to control information, and then the aperture pattern setting portion 10 is moved so as to be registered under the window 9 of the shielding board 7 successively, and finally the ion beam is irradiated for a prescribed time for each aperture pattern by controlling the duration during which the shutter 9 (S7 to S9) remains open.

More specifically, the electrodes 3 of Column B are moved under the window 8, the aperture pattern A is set on the electrodes 3 of Column B (S7), the ion beam is irradiated for 2 a.u., and subsequently, the aperture pattern E is set on the electrodes 3 of Column B (S7), the ion beam is irradiated for 2 a.u. (S8), and finally the aperture pattern G is set on the electrodes 3 of Column B (S7), and the ion beam is irradiated for 2 a.u. (S8). In this case again, the aperture patterns A, E, and G may be used in arbitrary order, for example in reverse order.

By repeating these treatments (S7 to S11), upon completion of frequency control for all the electrodes 3 on the piezoelectric substrate (S10), the carrier tray is removed from the frequency control apparatus 4 and the frequency controlled piezoelectric substrate 2 is removed from the carrier tray (S12).

According to such a frequency control apparatus 4, since all of the aperture patterns are provided on the pattern board 11, frequency control can be performed for the elements on individual basis by selecting appropriate aperture patterns according to the variations in the frequency of each element of each column and irradiating the ion beam for appropriate duration. In addition, since the pattern board 11 has all of the aperture patterns in advance, frequency control can be carried out rapidly and simply.

In order to select the aperture patterns according to the variations in frequency of each element, for example, a microcomputer may be used to select the aperture pattern. In this case, it is preferable to use fewer aperture patterns. In order to use fewer aperture patterns, priority should be given to the aperture patterns having many numbers of apertures.

Figure 7:
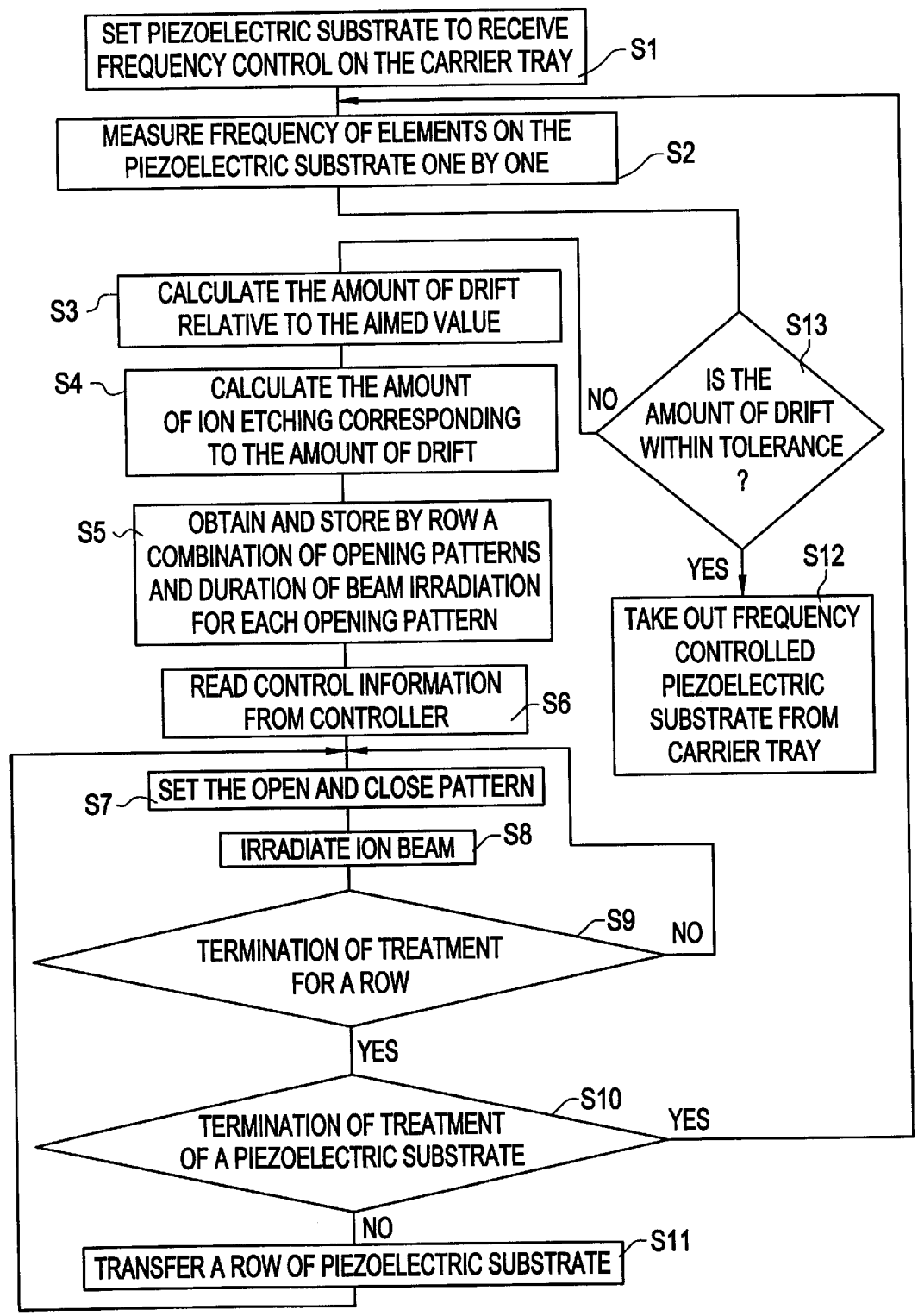
FIG. 7 is a flow chart showing other steps of frequency control in the frequency control process.

As shown in FIG. 4, it is also possible to return the piezoelectric substrate 2 to the frequency measuring apparatus 13 again after the frequency control has completed measuring the frequencies of respective elements and repeat the procedures until the drift of the frequency comes within the acceptable limits as the step S13 of FIG. 7.

When all the aperture patterns is provided on a pattern board as in the preferred embodiment described above, when the number of electrodes in a column increases, the number of aperture patterns increases suddenly. For example, when the number of electrodes in a column is three, there are $2^3=8$ possible aperture patterns, and when the number of electrodes in a column increases to six, the number of aperture patterns increases to $2^6=64$ possible aperture patterns. This makes the pattern board longer, the travel distance to change the aperture pattern longer, and the time to move the pattern board longer.

Figure 8:
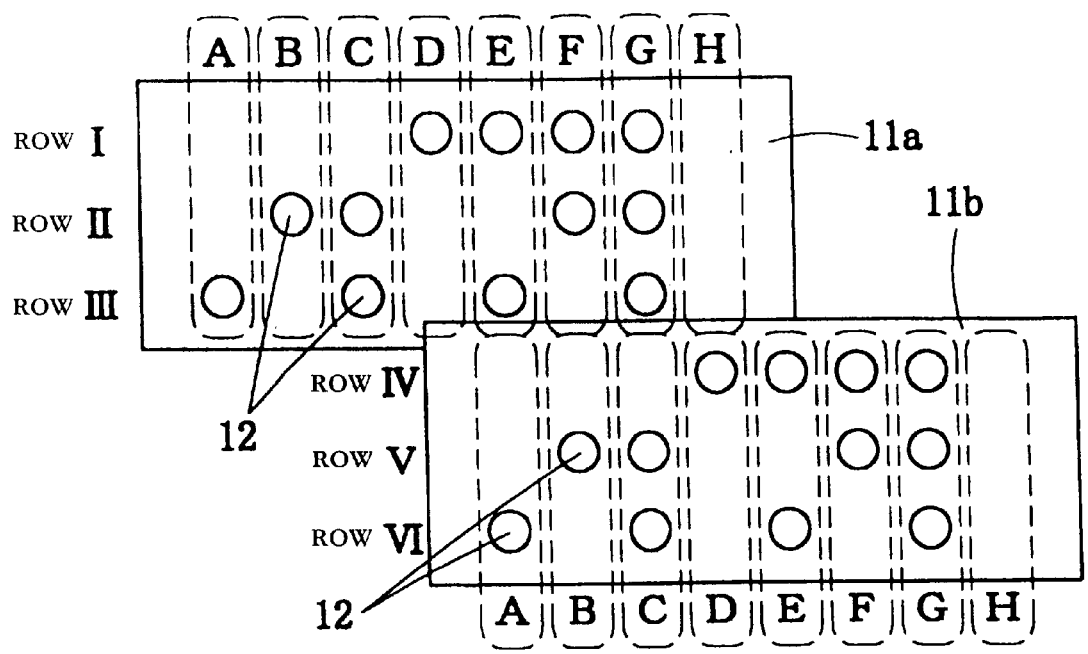
FIG. 8 is a plan view of a pattern board according to another preferred embodiment of the present invention.

FIG. 8 is a view illustrating a structure of the aperture pattern setting portion 10 according to another preferred embodiment of the present invention, which solves the problem described above. In this preferred embodiment, all of the aperture patterns may be achieved by combining two pattern boards 11a, and 11b. For example, in case where a column has six electrodes 3 (Row I to Row VI), one pattern board 11a is provided with a combination of apertures 12 arranged in three rows and eight columns corresponding to the electrode 3 from Row I to Row III, and the other pattern board 11b is provided with a combination of apertures 12 arranged in three rows and eight columns A to H corresponding to the electrodes 3 from Row IV to Row VI.

Accordingly, regarding the position of window 8 of the shielding board 7, since the pattern board 11a is disposed so as to cover the electrodes from Row I to Row III provided on the piezoelectric substrate 2 and the pattern board 11b is arranged so as to cover the electrodes 3 from Row IV to Row VI on the piezoelectric substrate 2, the apertures 12 on both of the pattern boards 11a and 11b are aligned under the window 8 of the shielding board 7 to constitute an aperture pattern corresponding a column of the electrodes 3. By moving the pattern boards 11a and 11b independently with respect to each other in a direction that is substantially parallel to the direction along which Column A to Column B are arranged, an arbitrary aperture pattern corresponding to the electrodes 3 of Row I to VI can be formed under the window 8 of the shielding board 7.

By using these pattern boards 11a and 11b, only eight columns of apertures 12 are required even for the electrodes 3 arranged in 6 rows. As a result, the configurations of the pattern boards 11a and 11b are simplified. Consequently, the travel distance of the pattern boards 11a and 11b may be shortened and consequently the time required for moving the pattern boards 11a and 11b may also be shortened.

Figure 9:
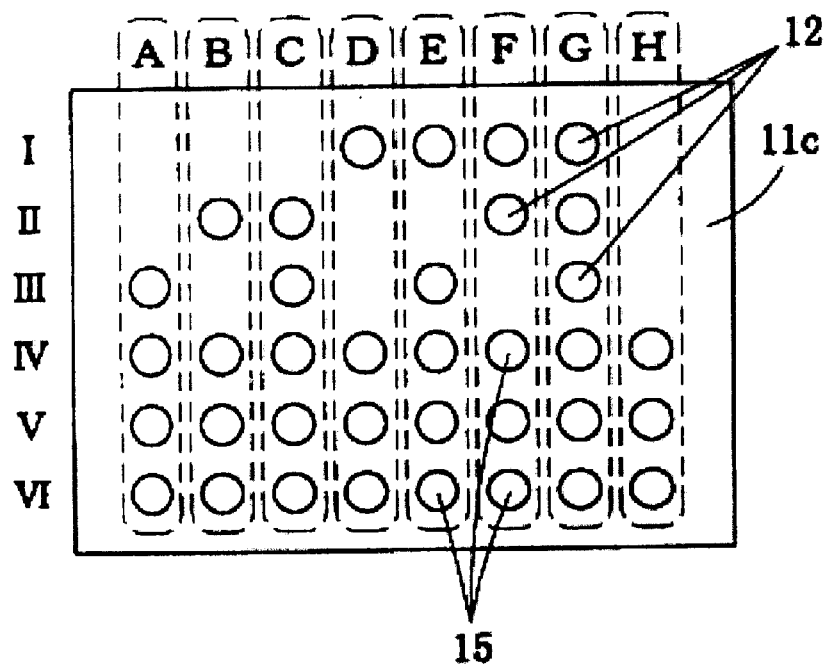
FIG. 9 is a plan view illustrating a pattern board of a different structure.
Figure 9:
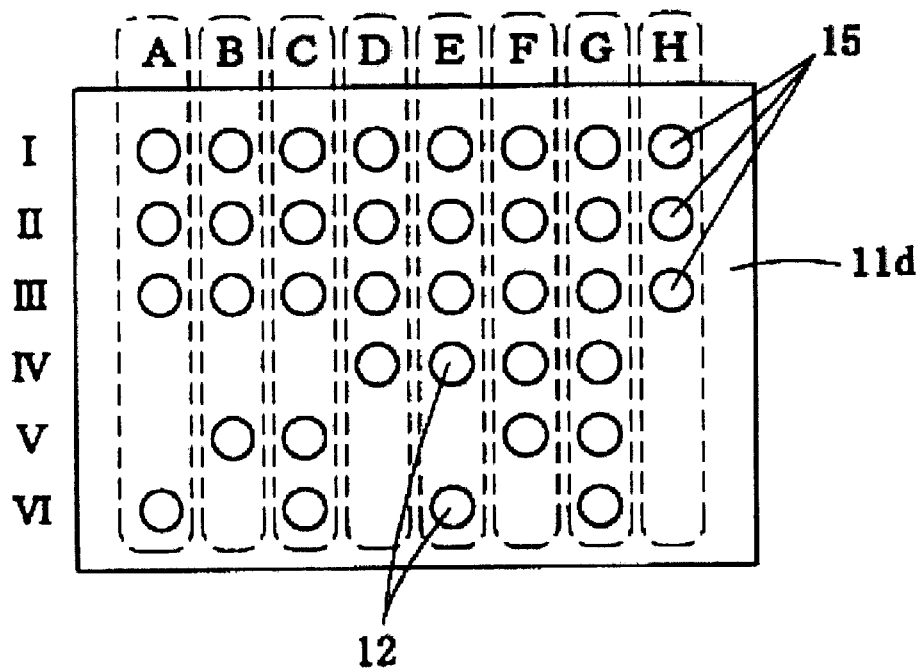

This preferred embodiment may also be constructed in such a manner that, as shown in FIG. 9, the pattern boards 11c and 11d are respectively provided with dummy apertures 15 to arrange the apertures 12 and 15 in six rows and eight columns (in case where the electrodes are arranged in six rows) on the respective pattern boards 11c and 11d, and are piled with one on top of the other. In other words, one of the pattern boards 11c is provided with apertures 15 arranged in the same pattern as Row I to Row III of the pattern board 11a, and also with dummy apertures 15 at all locations corresponding to the electrodes 3 for rows from Row IV to Row VI. While the other pattern board 11d is provided with apertures 12 arranged in the same pattern as Row IV to Row VI of the pattern board 11b and also with dummy apertures 15 at all locations corresponding to the electrodes 3 for the rows from Row I to Row III. Therefore, by putting the one board on top of the other board and displacing them with respect to each other, all the aperture patterns for the electrodes 3 arranged in six rows can be obtained.

While in the preferred embodiment of FIG. 9, the dummy apertures 15 preferably have a substantially round shape, it is also possible to provide elongated dummy apertures for accommodating a plurality of electrodes 3 (this is also applied to the preferred embodiments described below.).

Figure 10:
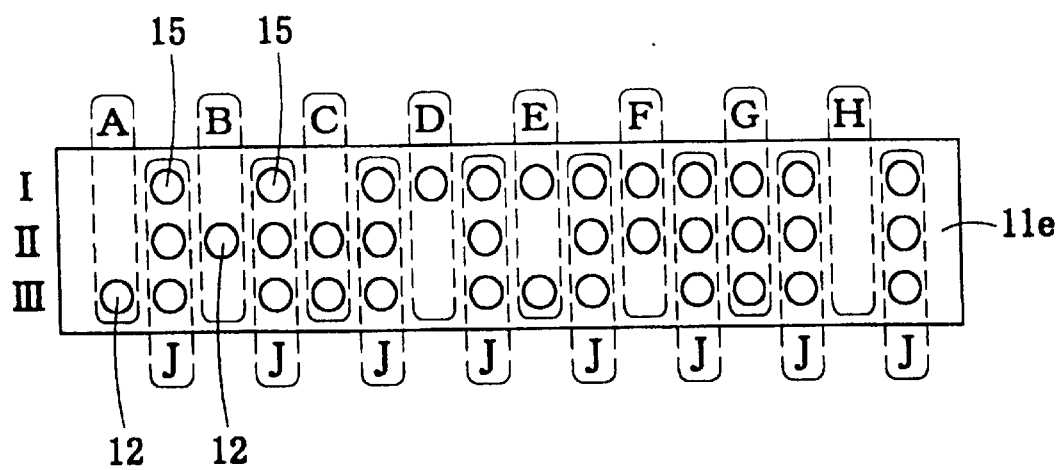
FIG. 10 is a plan view illustrating a pattern board according to still another preferred embodiment of the present invention.
Figure 10:
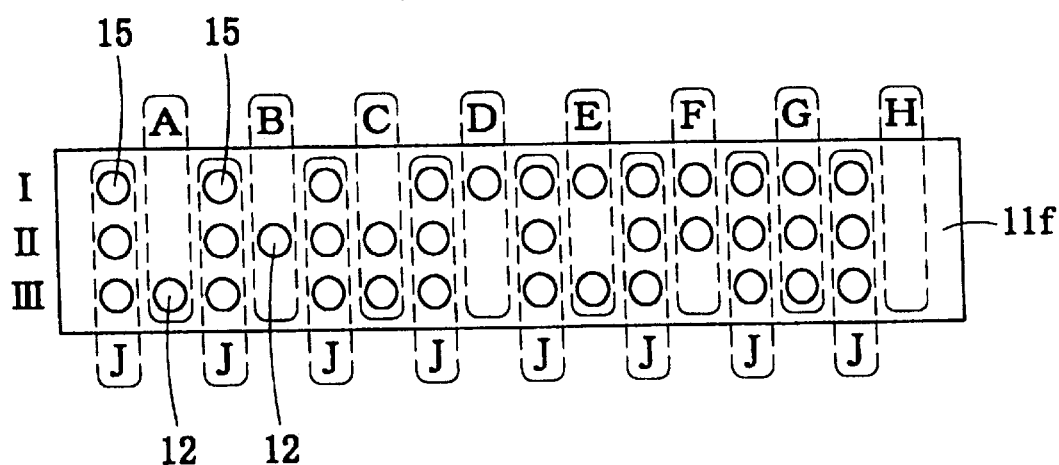

FIG. 10 is a plan view showing the structure of pattern boards 11e and 11f in still another preferred embodiment of the present invention. In this aperture pattern setting portion, by using two pattern boards 11e and 11f shown in FIG. 10 arranged with one on top of the other, the frequency of two columns of electrodes 3 may be controlled at a time.

For example, in order to control the frequency of two columns of electrodes 3 (6 electrodes) at the same time for the electrodes arranged in three rows (Row I to Row III), an aperture pattern having $2^6=64$ possible patterns will be required and therefore 128 (=64×2) columns of apertures must be arranged on the pattern board, which requires that the pattern board be even longer.

However, in the preferred embodiment shown in FIG. 10, all the patterns may be obtained by combining two pattern boards 11e and 11f. For example, in the case where three electrodes 3 are arranged in one column (Column I to Column III), one pattern board 11a is provided with apertures 12 composed of eight aperture patterns A to H corresponding to the electrodes 3 of Row I to Row III and dummy apertures 15 depicted by Column J arranged alternately, and the other pattern board 11b is provided with a plurality of dummy apertures 15 depicted by Column J and apertures 12 of eight aperture patterns A to H corresponding to the electrodes 3 of Row I to Row III arranged alternately.

Accordingly, two columns of aperture patterns (one of columns A to H and Column J) are exposed at a time under the window 8 of the shielding board 7. In other words, by arranging the pattern boards 11e and 11f with one on top of the other and aligning the apertures 12 (Column A to Column) on the pattern board 11e with the dummy apertures 15 (Column J) on the pattern board 11f, or by aligning the dummy apertures 15 (Column J) on the pattern board 11e with the apertures (Column A to Column H) on the pattern board 11f, all the aperture pattern for two columns of electrodes 3 are obtained.

With these pattern boards 11e and 11f, for example, the electrodes 3 arranged in three rows and two columns can be treated at a time only by providing apertures 12 and 15 arranged in sixteen columns respectively, and therefore the configuration of the pattern boards 11e and 11f is greatly simplified. As a result, the travel distance of the pattern boards 11e and 11f can be shortened, and thus the time required to move the pattern boards 11e and 11f can also be shortened.

Figure 11:
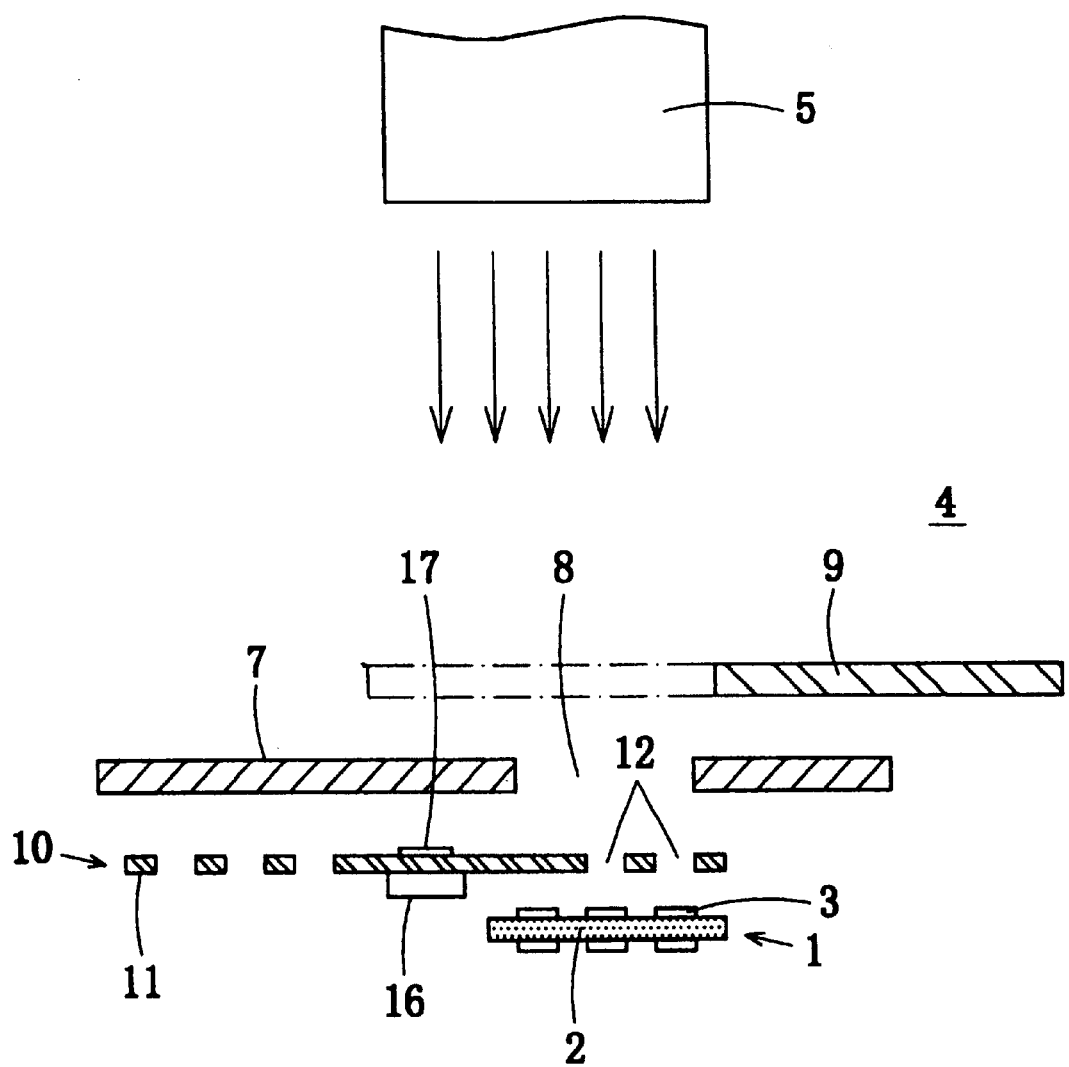
FIG. 11 is a cross-sectional view illustrating a structure of a frequency control apparatus according to a further preferred embodiment of the present invention.

FIG. 11 illustrates a schematic cross-sectional view illustrating a structure of the frequency control apparatus according to further preferred embodiment of the present invention. In this preferred embodiment, the aperture pattern setting portion 10 is a rotary type wherein the pattern board 11 is rotationally moved by being mounted on the axis of rotation 17 of the motor 16 such as a servo motor or pulse step motor.

Figure 12:
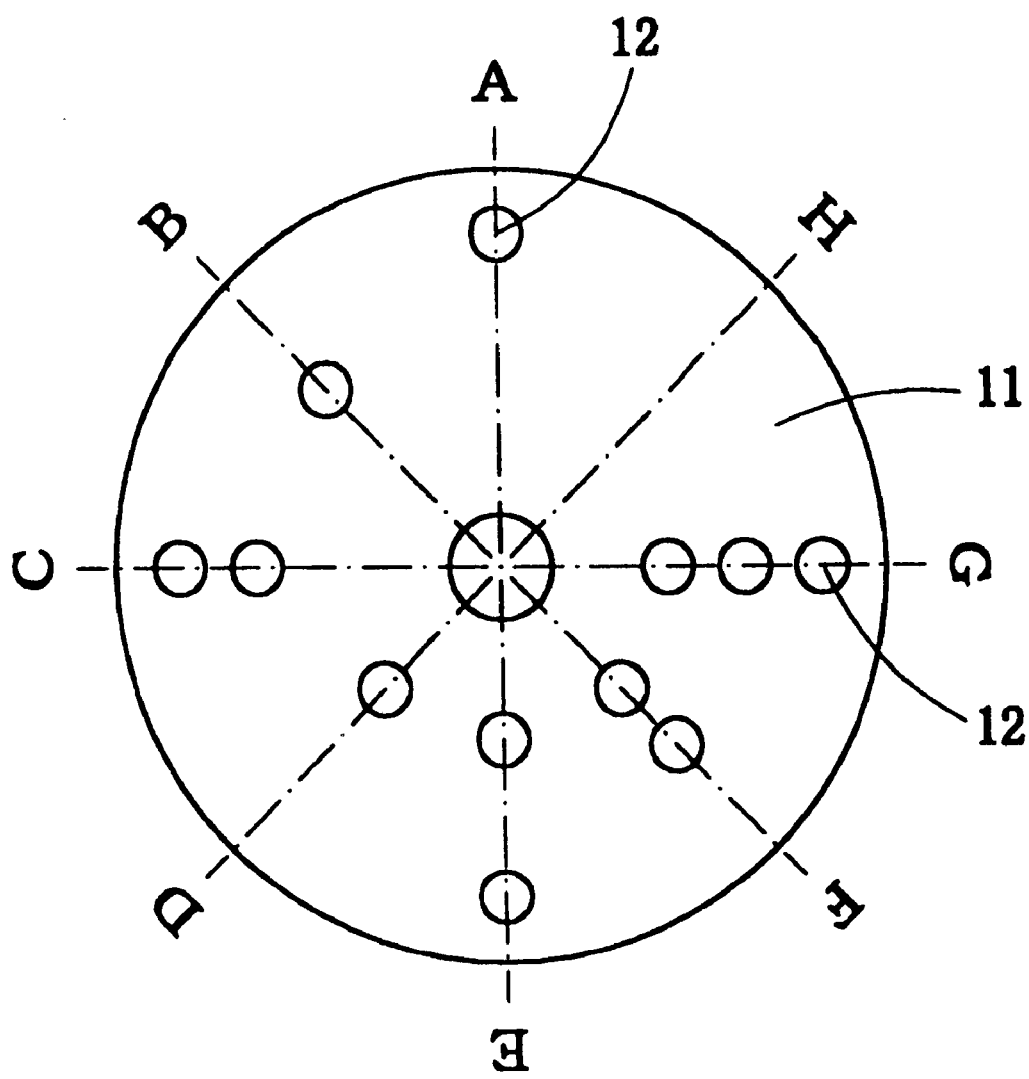
FIG. 12 is a plan view of a pattern board used in the frequency control apparatus of FIG. 11.

The pattern board 11 preferably has the geometry of a disc as shown in FIG. 12, and is provided with radially arranged aperture patterns A to H for three electrodes 3, respectively. Since the aperture pattern setting portion 10 is arranged so that the direction of radius of the pattern board 11 is substantially parallel with the window 8 on the shielding board 7, any one of the aperture patterns A to H may be exposed under the window 8 by rotating the pattern board 11 by the motor 16.

By using the pattern board 11 of the rotary type as in this preferred embodiment, the pattern board 11 may be moved by the motor 16, so that the driving mechanism used for the aperture pattern setting portion 10 is simplified in comparison with the system where the pattern board 11 is linearly moved. In addition, using the driving mechanism wherein the direction of rotation is selectable between the normal direction and the reverse direction enables further rapid operation. On the other hand, by using the pattern board 11 which is linearly moved as in the first preferred embodiment or the second preferred embodiment, the region on the pattern board 11 where no aperture is provided can be decreased so that the size of the pattern board 11 can be decreased.

Figure 13A:
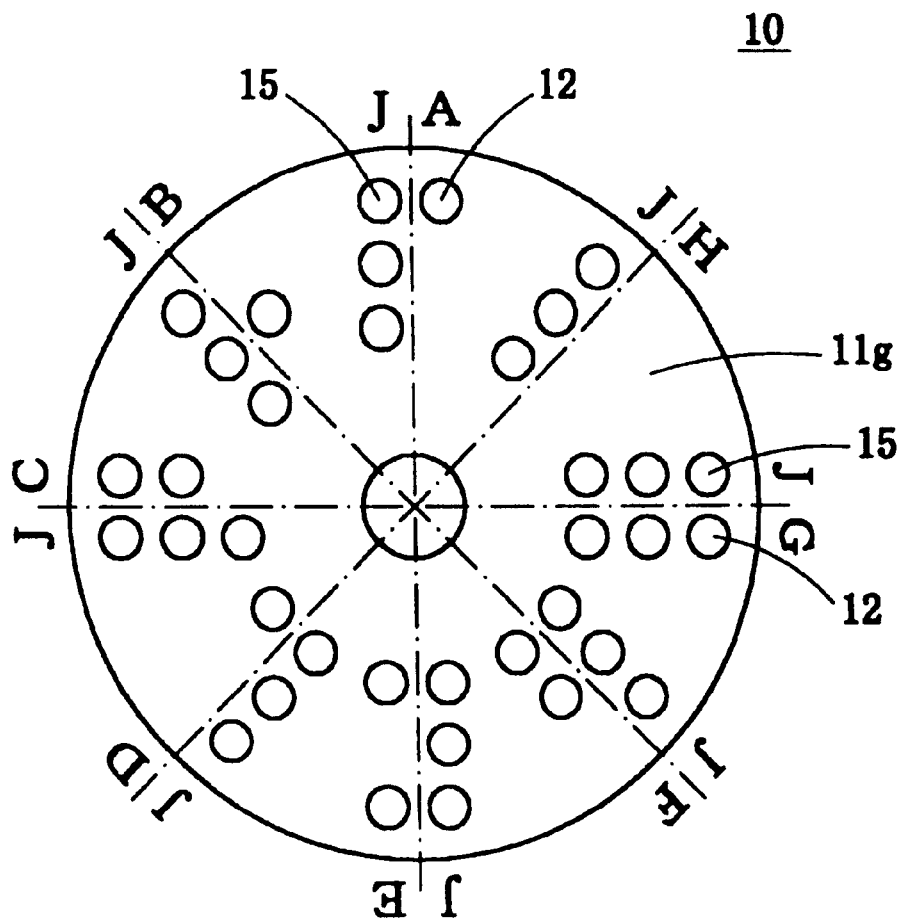
FIGS. 13A and 13B are a plan view and a front view respectively showing an aperture pattern setting portion of a still further preferred embodiment of the present invention.
Figure 13B:
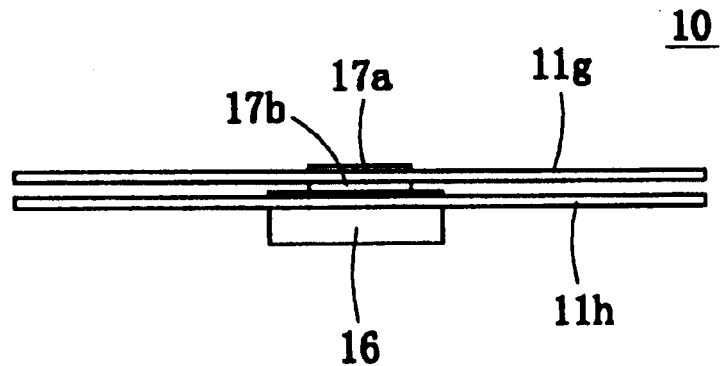

FIGS. 13A and 13B are a plan view and a front view respectively showing an aperture pattern setting portion 10 according to another preferred embodiment of the present invention. This preferred embodiment uses the aperture pattern setting portion 10 of a rotary type for enabling frequency control of two columns of electrodes 3 at the same time, which corresponds to the preferred embodiment of FIG. 10 where the patterns 11e and 11f are linearly moved.

Figure 14:
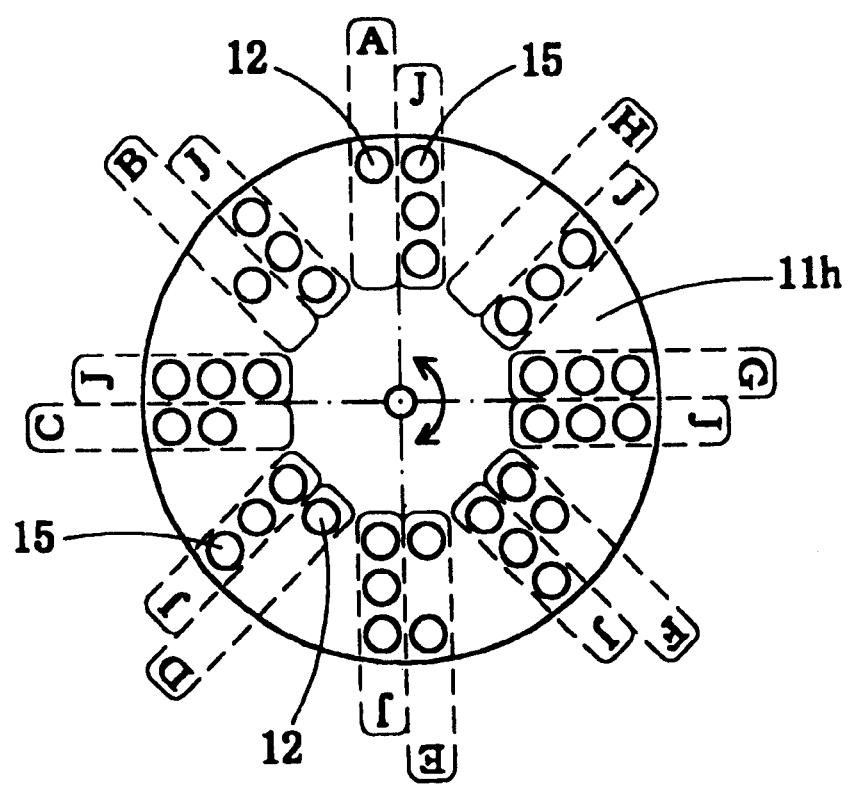
FIG. 14 a plan view showing each pattern board used in an aperture pattern of FIG. 13.

In this aperture pattern setting portion 10, there are provided two pattern boards 11g and 11h mounted on each axis of rotation 17a and 17b of a biaxial motor 16 respectively, and these two pattern boards 11g and 11h can be rotated independently. As shown in FIG. 13A, on the upper pattern board 11g, there are provided the aperture patterns A to H including a combination of the apertures 12 corresponding to a column of the electrodes 3 and the dummy aperture patterns J including the dummy apertures 15 radially and adjacent to each other, and on the lower pattern board 11h, as shown in FIG. 14, there are provided the dummy aperture patterns J including the dummy apertures 15 and the aperture patterns A to H including a combination of the apertures 12 corresponding to a column of the electrodes 3 radially and adjacent to each other, so that the aperture patterns A to H of the upper pattern board 11g are aligned with the dummy aperture patterns J on the lower pattern board 11h, and the dummy aperture patterns J on the upper pattern board 11g is aligned with the aperture patterns A to H on the lower pattern board 11h.

Figure 15A:
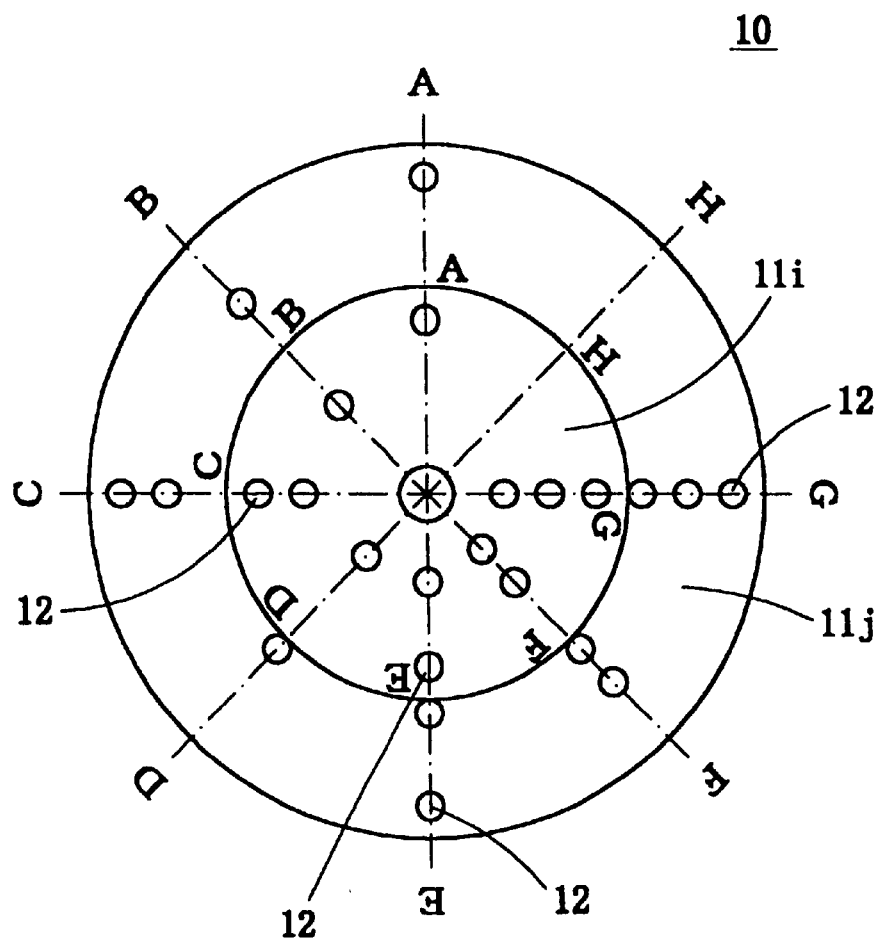
FIGS. 15A and 15B are a plan view and a front view respectively showing an aperture pattern setting portion of a still further preferred embodiment of the present invention.
Figure 15B:
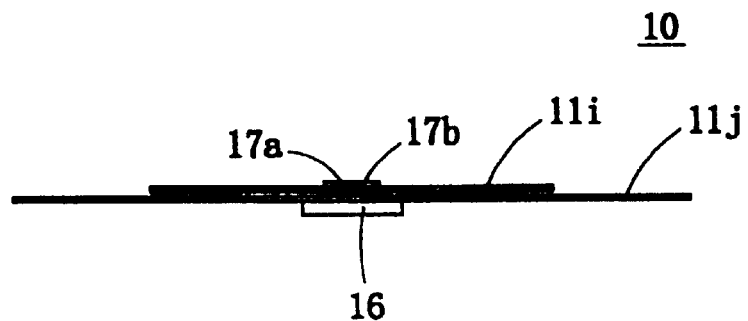

FIGS. 15A and 15B are a plan view and a front view respectively illustrating an aperture pattern setting portion 10 according to yet another preferred embodiment of the present invention. In this preferred embodiment, the aperture pattern setting portion 10 is a rotary type wherein the frequency of the electrodes 3 arranged in a large number of rows can be controlled by using two pattern boards 11i and 11j, which almost corresponds to the preferred embodiment shown in FIG. 9 wherein the pattern boards 11c and 11d are linearly moved.

Figure 16:
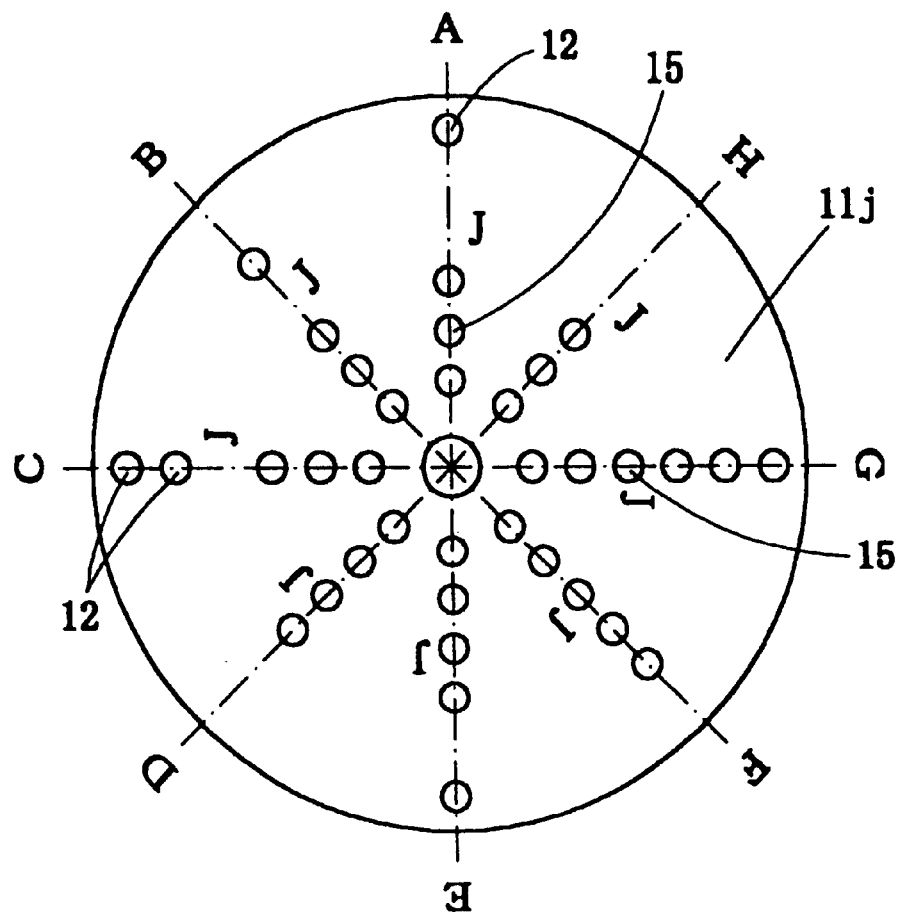
FIG. 16 is a plan view illustrating a lower pattern board used in the aperture pattern setting portion of FIG. 15.

In this aperture pattern setting portion 10, there are provided two pattern boards 11i and 11j mounted on each axis of rotation 17a and 17b of a biaxial motor 16 respectively, and these two pattern boards 11i and 11j can be rotated independently. As shown in FIG. 15A, on the upper pattern board 11i, there are provided the aperture patterns A to H including a combination of the apertures 12 which correspond to the half a column of electrodes 3 radially, and on the lower pattern board 11j, as shown in FIG. 16, the aperture patterns A to H (on the side of peripheral edge) including a combination of the apertures 12 which correspond to the remaining half of a column of electrodes and the dummy aperture patterns J (on the side near the center) including the dummy apertures 15 radially, and linearly aligned with respect to each other, so that the aperture patterns A to H on the upper pattern board 11i are aligned with the dummy aperture patterns J on the lower pattern board 11j.

Figure 17:
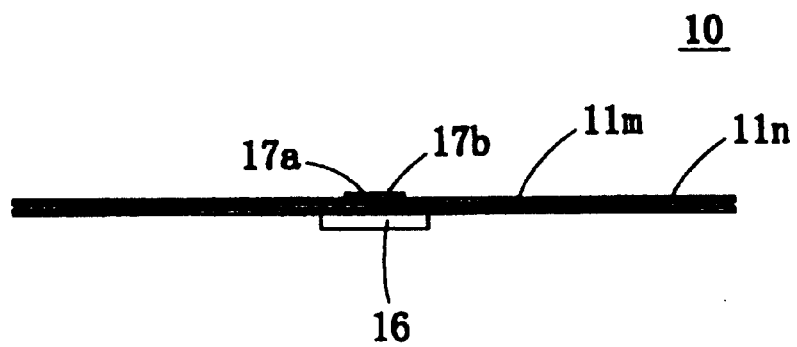
FIG. 17 is a front view illustrating the aperture pattern setting portion according to another preferred embodiment of the present invention.
Figure 18A:
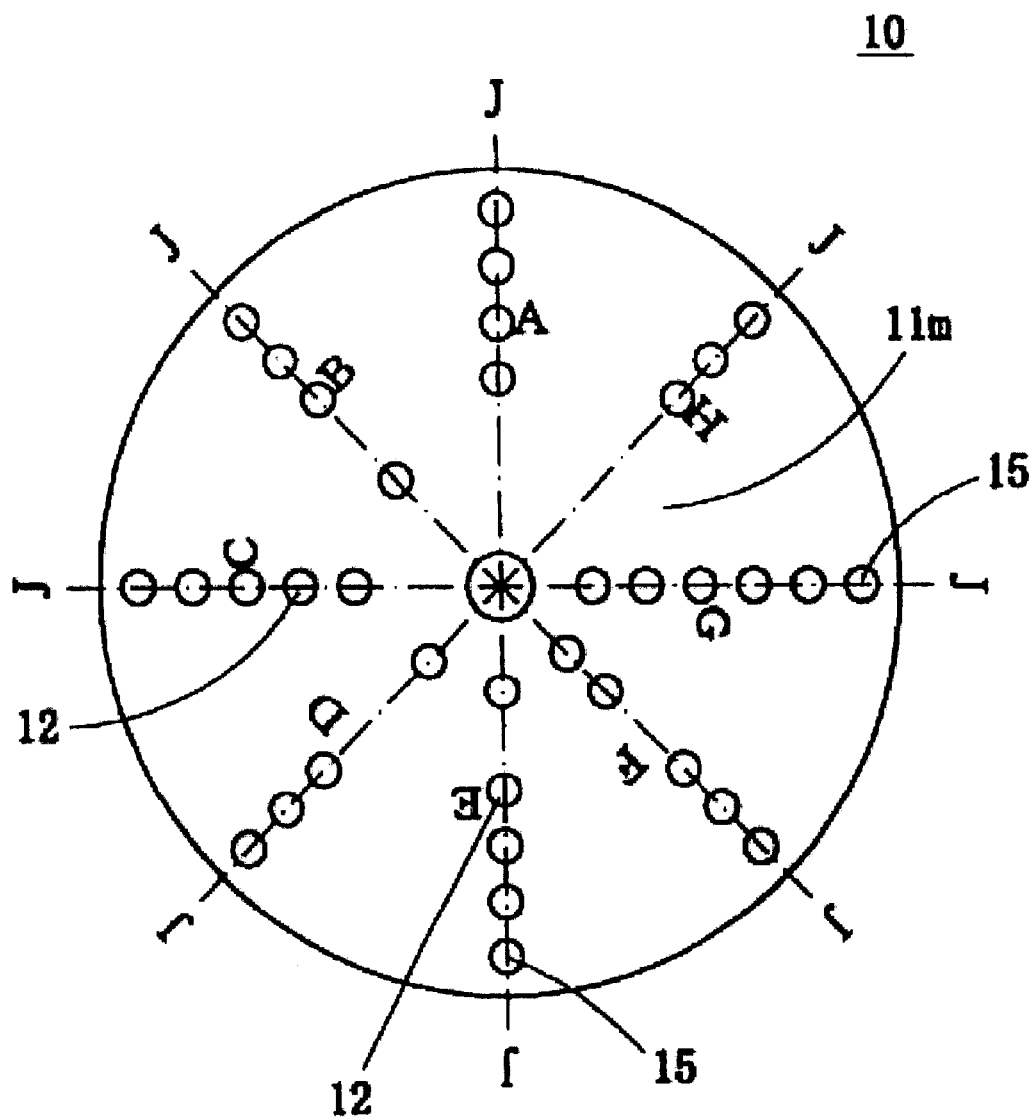
FIGS. 18A and 18B are plan views illustrating an upper pattern board and a lower pattern board used in the aperture pattern setting portion of FIG. 17.
Figure 18B:
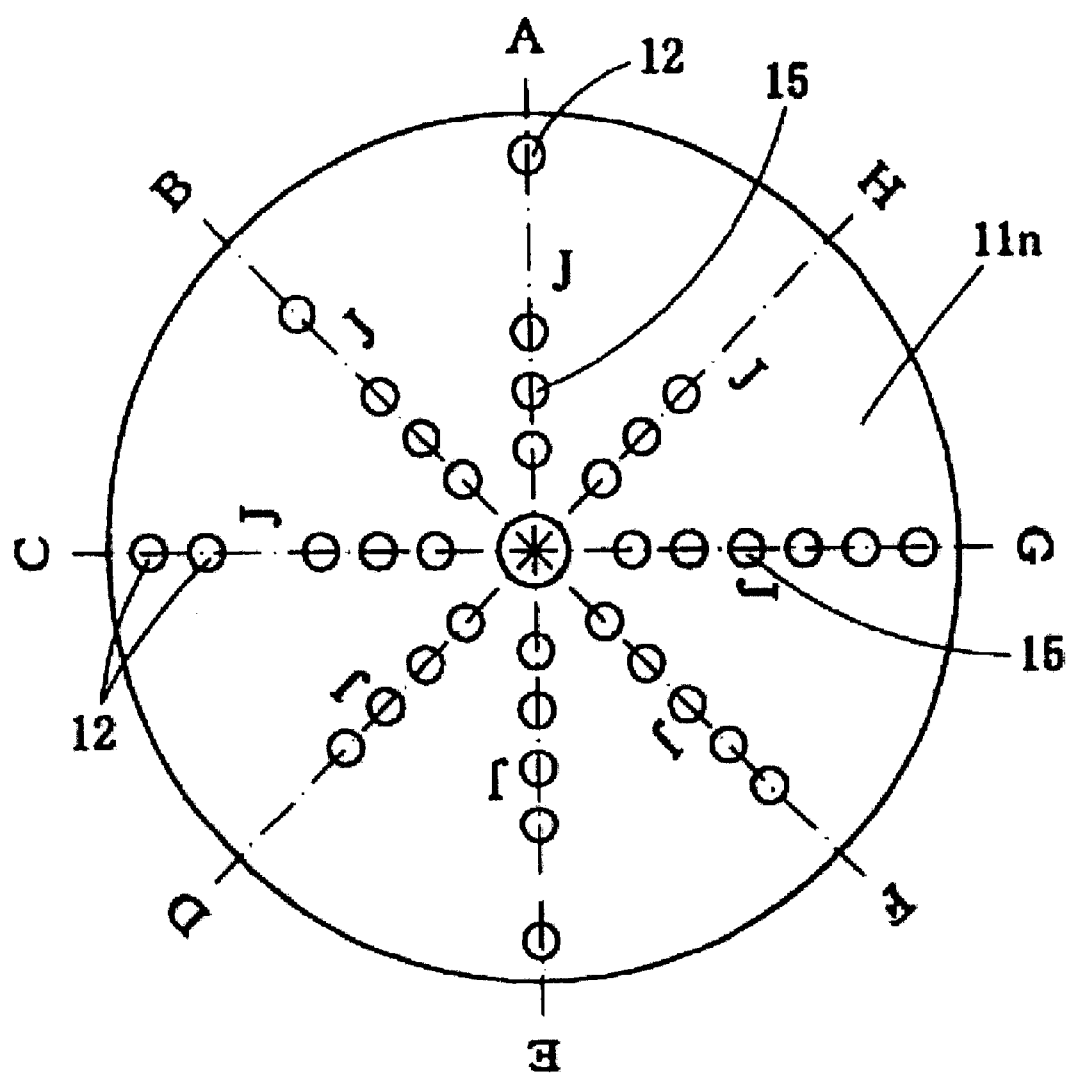

FIG. 17 is a front view illustrating the aperture pattern setting portion 10 according to another preferred embodiment of the present invention. FIG. 18A is a plan view showing the upper pattern board 11m of FIG. 7, and FIG. 18B is a plan view showing the lower pattern board 11n of FIG. 7. In this preferred embodiment, the aperture pattern setting portion 10 is also a rotary type, which corresponds to the preferred embodiment shown in FIG. 9 wherein the pattern boards 11c and 11d are moved linearly (or the modification of the preferred embodiment shown in FIG. 15).

In this aperture pattern setting portion 10, two pattern boards 11m and 11n of the same outside dimension are mounted on the each axis of rotation 17a and 17b of a biaxial motor 16 respectively and these pattern boards 11m and 11n can be rotated independently. As shown in FIG. 18(a), there are provided the aperture pattern A to H including a combination of the apertures 12 which correspond to the half a column of electrodes 3 and the dummy aperture pattern J including dummy apertures 15 (on the side of peripheral edge) radially and linearly aligned with respect to each other, so that the aperture patterns A to H on the upper pattern board 11m are aligned with the dummy aperture pattern J on the lower pattern board 11n, and the dummy aperture patterns J on the upper pattern board 11m are aligned with the aperture patterns A to H of the lower pattern board 11n.

Figure 19A:
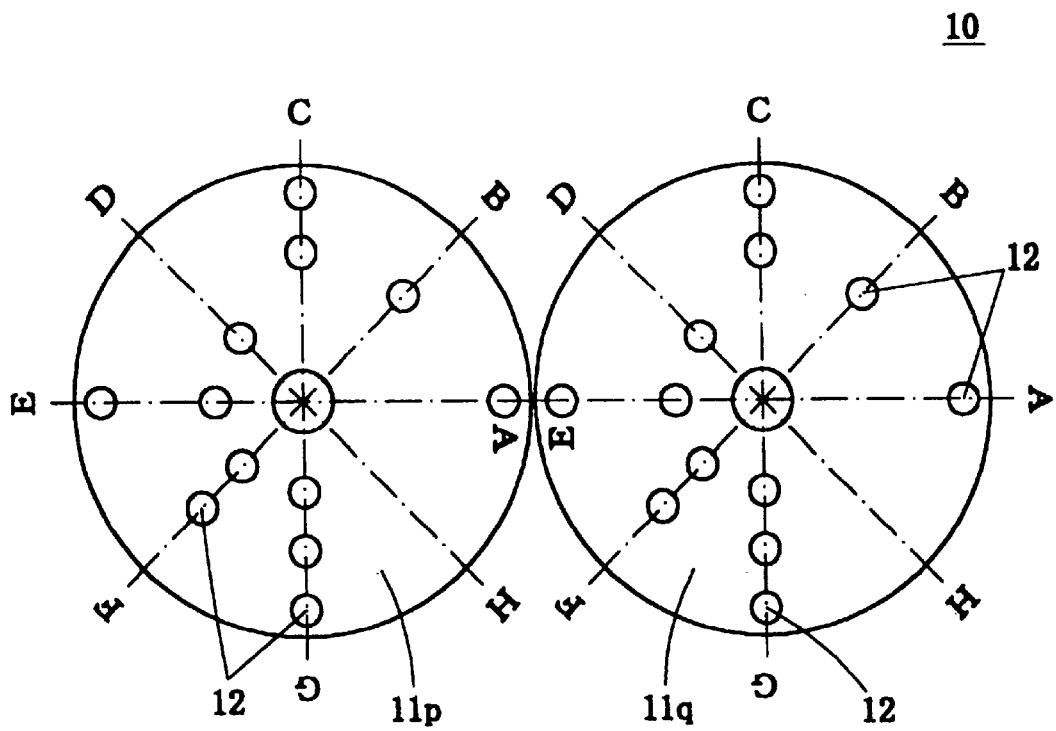
FIGS. 19A and 19B are a plan view and a front view respectively illustrating an aperture pattern setting portion according to still further preferred embodiment of the present invention.
Figure 19B:
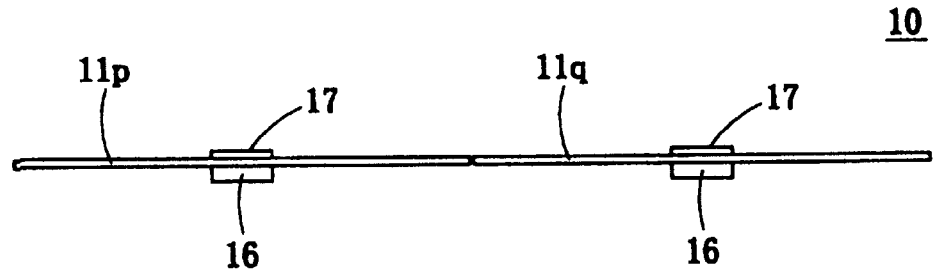

FIGS. 19A and 19B are a plan view and a front view illustrating an aperture pattern setting portion according to a further preferred embodiment of the present invention. In this preferred embodiment as well, the aperture pattern setting portion 10 is a rotary type wherein the frequency of the electrodes 3 arranged in a large number of rows can be controlled by using two pattern boards 11p and 11b, which corresponds to the preferred embodiment of FIG. 8 wherein the pattern boards 11a and 11b are linearly moved.

In this aperture pattern setting portion 10, the pattern boards 11p and 11q are mounted on the separate motors 16 respectively so that they can rotate independently. On a pattern board 11p, there are provided the aperture patterns A to H including the apertures 12 which correspond to the half of a column of electrodes 3 radially, and on the other pattern board 11q, there are provided the aperture patterns A to H including a combination of the apertures 12 which correspond to the remaining half a column of the electrodes 3, and both of pattern boards 11p and 11q are arranged in such a manner that the peripheral edges thereof are located in close vicinity with respect to each other. Therefore, by linearly aligning respective aperture patterns A to H on both of pattern boards 11p and 11q, all the aperture patterns for a column of electrodes can be obtained.

Figure 20:
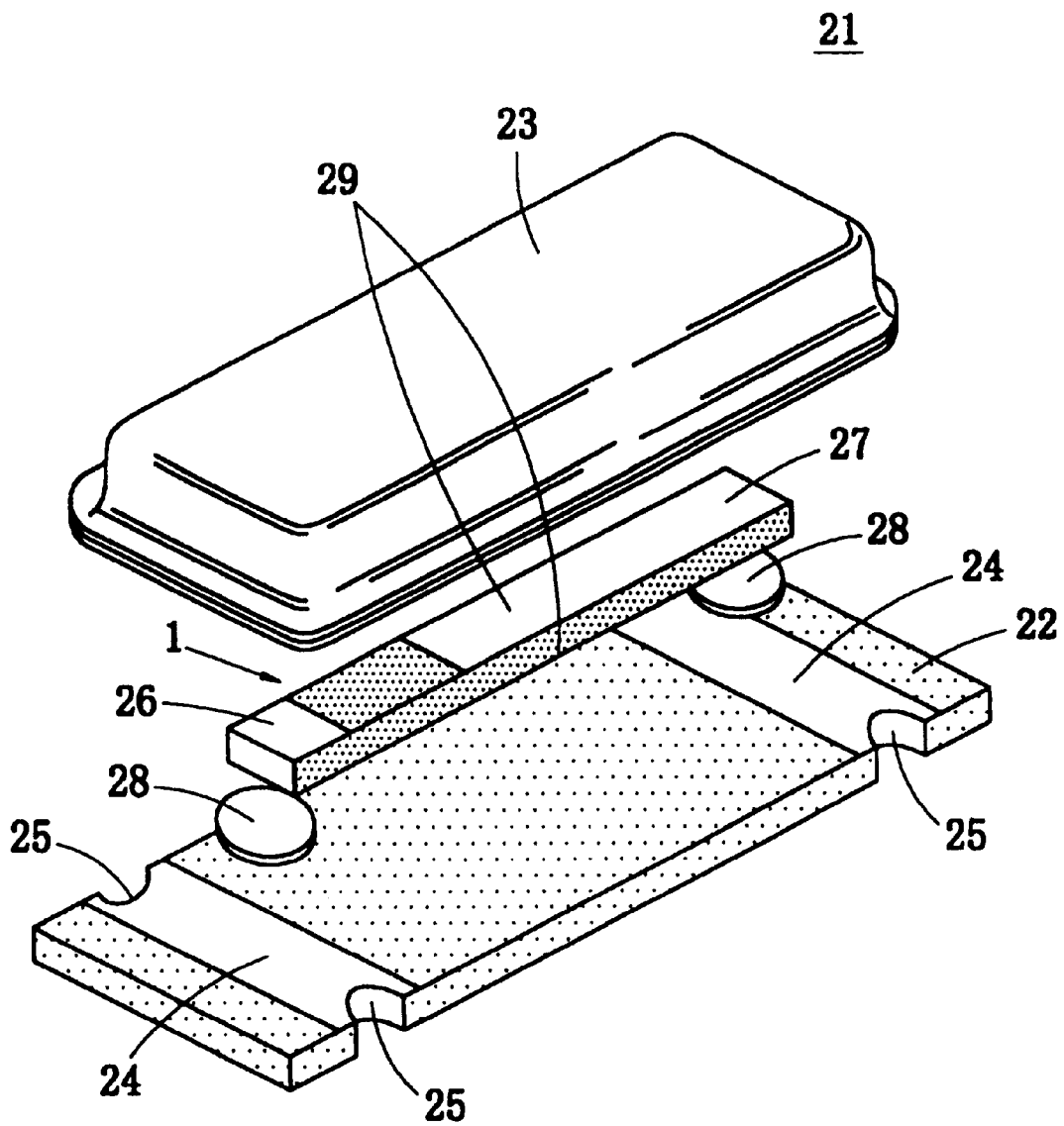
FIG. 20 is an exploded perspective view illustrating a piezoelectric resonator which is processed for frequency control according to still further preferred embodiment of the present invention.

The frequency control apparatus of preferred embodiments of the present invention may be used not only for controlling the frequencies of the piezoelectric resonator having a plurality of electrodes, but also for controlling the frequencies of the piezoelectric resonator having only one electrode (vibrating electrode) on one side, as shown in FIG. 20. The piezoelectric resonator 21 preferably includes a substrate 22, a piezoelectric resonator 1 and a cap 23. Two external electrodes 24 are arranged on both ends of the substrate 22 so as to extend to concave through hole portions 25 (through hole divided into two) formed on both side edges of the substrate 22 to establish electrical conductivity with the electrode provided on the inner surface of the through hole portions 25. On the external electrodes 24, the piezoelectric resonator 1 is attached by conductive adhesive having both conductivity and adhesiveness such as conductive adhesive or solder. The piezoelectric resonator 1 vibrates in a thickness slide vibration mode wherein the electrode 26 is arranged to extend from the end of the surface of the piezoelectric substrate 2 across the area about two-thirds thereof, and the electrode 26 extends from the other end of the rear surface thereof across the area about two thirds. The end portions of the electrodes 26 and 27 are facing with each other at the intermediate region via the piezoelectric substrate 2 to form an electrode (vibration electrode) 29, as a vibrating portion, and the electrode 20 is kept out of contact with the substrate 22 by establishing a prescribed space defined by the thickness of the conductive adhesive 28.

Figure 21:
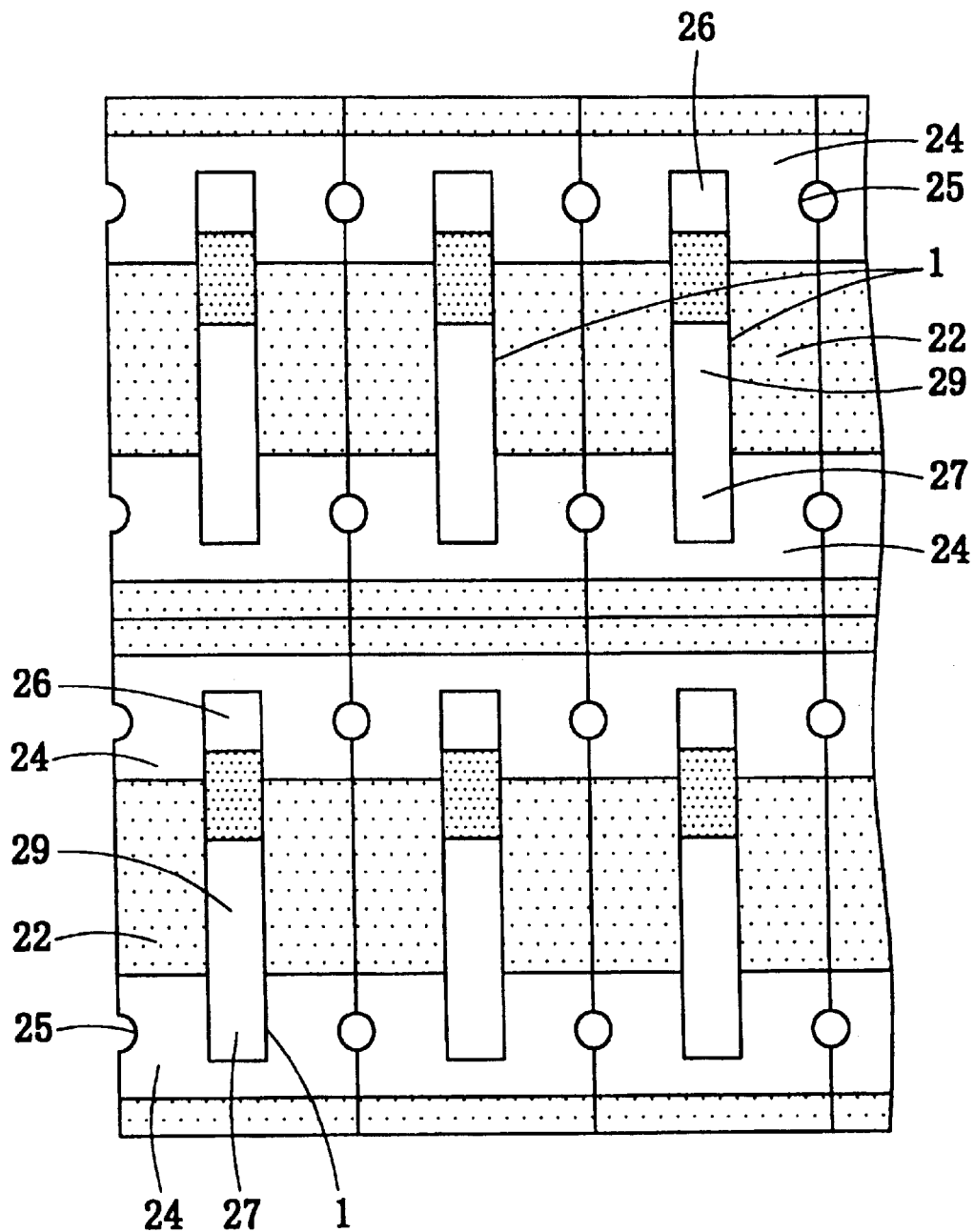
FIG. 21 is a plan view illustrating piezoelectric resonators of FIG. 20 aligned in rows and columns with caps removed.

In this way, even in the case where there is only one electrode 20 on the surface of the piezoelectric resonator 1, the frequency of a plurality of piezoelectric resonators 1 can be controlled at the same time by carrying out the frequency control procedure with the frequency control apparatus of preferred embodiments of the present invention for the piezoelectric resonator 1 provided on the substrate 22 arranged as shown in FIG. 21 (or before cutting the mother substrate containing a plurality of piezoelectric resonators 1 into individual substrates 22).

In preferred embodiments described above, the frequency control for the electrode is carried out by forming the electrode so as to have elements with frequencies that are lower than the target value in advance, and then by etching each element by irradiating ion beams according to the measurement value of the frequency for each element. On the contrary, however, forming the electrode so as to have elements of higher frequencies than the target value in advance, and then adding the frequency control substance on the on the electrode according to the measurements of frequency for each element is also possible. Alternatively, the frequency control may also be carried out by measuring the frequencies for respective elements first, and then removing portions of the electrodes for the element having the lower frequency than the target value and adding the frequency control substance to the electrode for the element having the higher frequency than the target value.

In accordance with a first aspect of preferred embodiments of the present invention, since the electrodes provided on the piezoelectric substrate are exposed selectively through the aperture pattern on the pattern board and aperture patterns are exposed selectively through the window on the shielding board, frequency is accurately and precisely controlled by selectively exposing electrodes which require frequency control through the aperture pattern according to variations in frequency of respective elements including electrodes from the target frequency, and removing portions of those exposed electrodes.

In addition, in accordance with the first aspect of preferred embodiments of the present invention, frequencies of a plurality of electrodes may be controlled at the same time with efficiency by a group of electrodes exposed simultaneously through the window on the shielding board. By repeating frequency control procedures after changing the aperture pattern to be exposed through the window on the shielding board, very precise frequency control can be achieved for a plurality of electrodes exposed through the window on the shielding board, and thus, frequencies of individual elements can be controlled with very high precision.

In accordance with the second aspect of preferred embodiments of the present invention, since the electrodes provided on the piezoelectric substrate are exposed selectively through the aperture pattern on the pattern board, and the predetermined aperture patterns are exposed selectively through the window on the shielding board, frequency may be controlled by selectively exposing electrodes which require frequency control through the aperture pattern according to variations in frequency of respective elements including electrodes from the target frequency and applying a frequency control substance only on those exposed electrodes that require frequency control.

In addition, in accordance with the second aspect of preferred embodiments of the present invention, frequencies of a plurality of electrodes may be controlled at the same time with efficiency by a group of electrodes exposed simultaneously through the window on the shielding board. By repeating frequency control procedures after changing the aperture pattern to be exposed through the window on the shielding board, very precise frequency control can be achieved for a plurality of electrodes exposed through the window on the shielding board, and thus, frequencies of individual elements can be controlled with very high precision.

In accordance with the third aspect of preferred embodiments of the present invention, since the electrodes provided on a plurality of piezoelectric substrates can be exposed selectively through the aperture pattern on the pattern board and the predetermined aperture pattern can be exposed selectively through the window on the shielding board, frequency control can be performed by selectively exposing electrodes which require frequency control through the aperture pattern according to variations in frequency of respective elements including electrodes from the target frequency and removing portions of those exposed electrodes.

In addition, in accordance with the third aspect of preferred embodiments of the present invention, frequencies of a plurality of piezoelectric substrates are controlled at the same time with efficiency by a group of electrodes exposed simultaneously through the window on the shielding board. By repeating frequency control procedures after changing the aperture pattern to be exposed through the window on the shielding board, very precise frequency control can be achieved for a plurality of electrodes exposed through the window on the shielding board, and thus frequencies of elements provided on respective piezoelectric substrates are controlled with very high precision.

In accordance with the fourth aspect of preferred embodiments of the present invention, since the electrodes provided on a plurality of piezoelectric substrates are exposed selectively through the aperture pattern on the pattern board and the predetermined aperture patterns are exposed selectively through the window on the shielding board, frequency may be controlled by selectively exposing electrodes which require frequency control through the aperture pattern according to variations in frequency of respective elements including electrodes from the target frequency and applying frequency control substance only on those exposed electrodes.

In addition, in accordance with the fourth aspect of preferred embodiments of the present invention, frequencies of a plurality of piezoelectric substrates are controlled at the same time with efficiency by a group of electrodes exposed simultaneously through the window on the shielding board. By repeating frequency control procedures after changing the aperture pattern to be exposed through the window on the shielding board, very fine frequency control can be achieved for a plurality of electrodes exposed through the window on the shielding board, and thus frequencies of elements provided on respective piezoelectric substrates can be controlled with very high precision.

In accordance with the fifth aspect of preferred embodiments of the present invention, since the electrodes are exposed selectively by a combination of a plurality of pattern boards having aperture patterns thereon, the number of the aperture patterns to be formed on each pattern board can be reduced. The total number of aperture patterns to be formed on the pattern boards can also be reduced. As a result, the structure of the pattern board is simplified, and the distance of movement of the pattern board is shortened to achieve rapid control of the frequency.

In accordance with the sixth aspect of preferred embodiments of the present invention, since the frequency control apparatus for piezoelectric components is provided with a shutter for opening and closing the window on the shielding board, the amount of removal of electrodes or the amount of application of frequency control substance on the electrodes can be controlled by controlling the duration of opening and closing of the window, and the frequency of elements can be controlled with very high precision.

In accordance with the seventh aspect of preferred embodiments of the present invention, since the pattern board of the frequency control apparatus for piezoelectric components is linearly moved, the waste region in the pattern boards is greatly reduced in comparison with the apparatus of the type wherein the pattern board is rotatably moved, and the pattern boards can be used effectively with decreased size.

In accordance with the eighth aspect of preferred embodiments of the present invention, since the pattern board is rotationally moved, the aperture pattern board can be moved by, for example, a motor. Thus, the driving system of the pattern board is simplified in comparison with the apparatus of the type wherein the pattern board is moved linearly.

In accordance with the ninth aspect of preferred embodiments of the present invention, since the electrodes provided on a piezoelectric substrate are exposed selectively through the aperture pattern on the pattern board and the predetermined aperture patterns are exposed selectively through the window on the shielding board, frequency may be controlled by selectively exposing electrodes which require frequency control through the aperture pattern according to variations in frequency of respective elements including electrodes from the target frequency and removing portions of those exposed electrodes.

In addition, in accordance with the ninth aspect of preferred embodiments of the present invention, frequencies of a plurality of electrodes are controlled at the same time with efficiency by a group of electrodes exposed simultaneously through the window on the shielding board. By repeating frequency control procedures after changing the aperture pattern to be exposed through the window on the shielding board, very accurate and fine frequency control can be achieved for a plurality of electrodes exposed through the window on the shielding board, and thus frequencies of individual elements can be controlled with very high precision.

In accordance with the tenth aspect of preferred embodiments of the present invention, since the electrodes provided on the piezoelectric substrate are exposed selectively through the aperture pattern on the pattern board and the predetermined aperture patterns are exposed selectively through the window on the shielding board, frequency may be controlled by selectively exposing electrodes which require frequency control through the aperture pattern according to variations in frequency of respective elements including electrodes from the target frequency and applying frequency control substance only to those exposed electrodes requiring adjustment.

In addition, in accordance with the tenth aspect of preferred embodiments of the present invention, frequencies of a plurality of electrodes are controlled at a time with efficiency by a group of electrodes exposed simultaneously through the window on the shielding board. By repeating frequency control procedures after changing the aperture pattern to be exposed through the window on the shielding board, fine frequency control can be achieved for a plurality of electrodes exposed through the window on the shielding board, and thus, frequencies of individual elements can be controlled with very high precision.

In accordance with the eleventh aspect of preferred embodiments of the present invention, since the electrodes provided on a plurality of piezoelectric substrates are exposed selectively through the aperture pattern on the pattern board and the aperture pattern is exposed selectively through the window on the shielding board, frequency may be controlled by selectively exposing electrodes which need frequency control through the aperture pattern according to variations in frequency of respective elements including electrodes from the target frequency and removing portions of those exposed electrodes.

In addition, in accordance with the eleventh aspect of preferred embodiments of the present invention, frequencies of a plurality of piezoelectric substrates are controlled at the same time with efficiency by a group of electrodes exposed simultaneously through the window on the shielding board. By repeating frequency control procedures after changing the aperture pattern to be exposed through the window on the shielding board, very fine frequency control can be achieved for a plurality of electrodes exposed through the window on the shielding board, and thus frequencies of elements provided on respective piezoelectric substrates can be controlled with very high precision.

In accordance with the twelfth aspect of preferred embodiments of the present invention, since the electrodes provided on a plurality of piezoelectric substrates are exposed selectively through the aperture pattern on the pattern board and the aperture patterns are exposed selectively through the window on the shielding board, frequency may be controlled by selectively exposing electrodes which require frequency control through the aperture pattern according to variations in frequency of respective elements including electrodes from the target frequency and applying frequency control substance only to those exposed electrodes requiring frequency control.

In addition, in accordance with the twelfth aspect of preferred embodiments of the present invention, frequencies of a plurality of piezoelectric substrates are controlled at the same time with efficiency by a group of electrodes exposed simultaneously through the window on the shielding board. By repeating frequency control procedures after changing the aperture pattern to be exposed through the window on the shielding board, fine frequency control can be achieved for a plurality of electrodes exposed through the window on the shielding board, and thus frequencies of electrodes formed on respective piezoelectric substrates can be controlled with very high precision.

In accordance with the thirteenth aspect of preferred embodiments of the present invention, since the electrodes are exposed selectively by a combination of a plurality of pattern boards having aperture patterns thereon, the number of the aperture patterns required to be formed on each pattern board is greatly reduced. The total number of aperture patterns to be formed on the pattern boards is also greatly be reduced. As a result, the structure of the pattern board is simplified, and the distance of movement of the pattern board can be shortened to achieve rapid control of the frequency.

In accordance with the fourteenth aspect of preferred embodiments of the present invention, since the method for controlling frequency of a piezoelectric components includes the step of providing a shutter for opening and closing the window on the shielding board, the amount of removal of electrodes or the amount of application of frequency control substance on the electrodes can be controlled by controlling the duration of opening and closing of the window, and the frequency of elements can be controlled with very high precision.

In accordance with the fifteenth aspect of preferred embodiments of the present invention, since the pattern board is linearly moved, the waste region in the pattern boards is greatly reduced in comparison with the apparatus of the type wherein the pattern board is rotationally moved, so that the pattern boards are used effectively to decrease the size thereof.

In accordance with the sixteenth aspect of preferred embodiments of the present invention since the pattern board is rotationally moved, the aperture pattern board can be moved, for example, by a motor, so that the driving system of the pattern board is simplified in comparison with the apparatus of the type wherein the pattern board is moved linearly.

Since the seventeenth aspect of preferred embodiments of the present invention includes the steps of forming the electrodes in matrix and exposing through the aperture pattern on a column-by column basis to control the frequency of respective electrodes on a column-by-column basis, the frequency of electrodes arranged on the piezoelectric board may be controlled on a column-by-column basis in orderly sequence.

Since the method for controlling the frequency of a piezoelectric component according to the eighteenth aspect of preferred embodiments of the present invention includes the steps of arranging the piezoelectric substrates having electrodes thereon in a matrix and exposing the electrodes on these piezoelectric substrates through the aperture pattern on a column-by column basis to control the frequency of respective electrodes on a column-by-column basis, the frequency of the piezoelectric boards having electrodes disposed thereon may be controlled on a column-by-column basis in orderly sequence.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A frequency control apparatus for piezoelectric components comprising:
    at least one pattern board disposed on a piezoelectric substrate of the piezoelectric components having a plurality of electrodes on the surface thereof and provided with aperture patterns for selectively exposing said plurality of electrodes;
    a shielding board disposed on said pattern board and provided with a window for selectively exposing at least one of the aperture patterns of the pattern board;
    an electrode removing unit arranged to remove portions of said plurality of electrodes exposed through the at least one of the aperture patterns of said pattern board and through the window on said shielding board; and
    a shutter arranged to open and close the window on said shielding board.

2. The frequency control apparatus for piezoelectric components according to claim 1, further comprising a plurality of pattern boards each having an aperture pattern and said patterns boards are arranged such that the electrodes are selectively exposed by combining the aperture patterns of said plurality of pattern boards.

3. The frequency control apparatus for piezoelectric components according to claim 1, wherein said pattern board is arranged to be linearly moved.

4. The frequency control apparatus for piezoelectric components according to claim 1, wherein said pattern board is arranged to be rotationally moved.

5. A frequency control apparatus for piezoelectric components comprising:
    at least on pattern board disposed on a piezoelectric substrate of the piezoelectric components having a plurality of electrodes on the surface thereof and provided with aperture patterns for selectively exposing said plurality of electrodes;
    a shielding board disposed on said pattern board and provided with a window for selectively exposing at least one of the aperture patterns of the pattern board;
    a frequency control substance applying device arranged to apply a frequency control substance to said plurality of electrodes and exposed through the at least one of the aperture patterns of said pattern board and through the window on said shielding board; and
    a shutter arranged to open and close the window on said shielding board.

6. The frequency control apparatus for piezoelectric components according to claim 5, further comprising a plurality of pattern boards each having an aperture pattern and said patterns boards are arranged such that the electrodes are selectively exposed by combining the aperture patterns of said plurality of pattern boards.

7. The frequency control apparatus for piezoelectric components according to claim 5, wherein said pattern board is arranged to be linearly moved.

8. The frequency control apparatus for piezoelectric components according to claim 5, wherein said pattern board is arranged to be rotationally moved.

9. A frequency control apparatus for piezoelectric components comprising:
    at least one pattern board disposed on a piezoelectric substrate of the piezoelectric electrodes on the surface thereof and an aperture pattern;
    a shielding board disposed on said pattern board and provided with a window for selectively exposing the aperture pattern of the pattern board;
    an electrode removing device arranged to remove portions of the electrodes exposed through the aperture pattern of said pattern board and through the window on said shielding board; and
    a shutter arranged to open and close the window on said shielding board.

10. The frequency control apparatus for piezoelectric components according to claim 9, further comprising a plurality of pattern boards each having an aperture pattern and said patterns boards are arranged such that the electrodes are selectively exposed by combining the aperture patterns of said plurality of pattern boards.

11. The frequency control apparatus for piezoelectric components according to claim 9, wherein said pattern board is arranged to be linearly moved.

12. The frequency control apparatus for piezoelectric components according to claim 9, wherein said pattern board is arranged to be rotationally moved.

13. A frequency control apparatus for piezoelectric components comprising:
    at least one pattern board disposed on a piezoelectric substrate of the piezoelectric electrodes on the surface thereof and an aperture pattern;

a shielding board disposed on said pattern board and provided with a window for selectively exposing the aperture pattern of the pattern board;

a frequency control substance applying device arranged to apply a frequency control substance to the electrodes provided on said plurality of piezoelectric substrates and exposed through the aperture pattern of said pattern board and through the window on said shielding board; and a shutter arranged to open and close the window on said shielding board.

14. The frequency control apparatus for piezoelectric components according to claim 13, further comprising a plurality of pattern boards each having an aperture pattern and said patterns boards are arranged such that the electrodes are selectively exposed by combining the aperture patterns of said plurality of pattern boards.

15. The frequency control apparatus for piezoelectric components according to claim 13, wherein said pattern board is arranged to be linearly moved.

16. The frequency control apparatus for piezoelectric components according to claim 13, wherein said pattern board is arranged to be rotationally moved.

17. A method for controlling the frequency of piezoelectric components comprising the steps of:

providing a piezoelectric substrate having a plurality of electrodes formed on a surface thereof;

disposing on said piezoelectric substrate at least one pattern board having an aperture pattern for selectively exposing the electrodes formed on said piezoelectric substrate;

disposing on said pattern board a shielding board having a window for selectively exposing the aperture pattern of said pattern board;

removing portions of the electrodes formed on said piezoelectric substrate and exposed through the aperture pattern of said pattern board and through the window of said shielding board; and using a shutter for opening and closing the window on said shielding board.

18. The method for controlling the frequency of piezoelectric components according to claim 17, wherein the electrodes are selectively exposed by combining aperture patterns of a plurality of said pattern boards.

19. The method for controlling the frequency of piezoelectric components according to claim 17, further comprising the step of linearly moving said pattern board.

20. The method for controlling the frequency of piezoelectric components according to claim 17, further comprising the step of rotationally moving said pattern board.

21. The method for controlling the frequency of piezoelectric components according to claim 17, further comprising the step of controlling the frequency of the electrodes on a column-by-column basis by arranging the electrodes on the piezoelectric substrate in a matrix arrangement including columns and rows, exposing electrodes through the aperture pattern of the pattern board and the window of the shielding board on a column-by-column basis, and removing portions of the electrodes.

22. The method for controlling the frequency of piezoelectric components according to claim 17, further comprising the step of controlling the frequency of the electrodes on a column-by-column basis by arranging piezoelectric substrates having electrodes thereon in a matrix including columns and rows, exposing the electrodes formed on the piezoelectric substrates through the aperture pattern of the pattern board and through the window of the shielding board on a column-by-column basis, and removing portions of the electrodes.

23. A method for controlling the frequency of piezoelectric components comprising the steps of:

providing a piezoelectric substrate having a plurality of electrodes formed on the surface thereof;

disposing on said piezoelectric substrate a pattern board having an aperture pattern for selectively exposing the plurality of electrodes formed on said piezoelectric substrate;

disposing on said pattern board a shielding board having a window for selectively exposing the aperture pattern of said pattern board;

applying a frequency control substance on the electrodes formed on said piezoelectric substrate and exposed through the aperture pattern of said pattern board and through the window of said shielding board; and using a shutter for opening and closing the window on said shielding board.

24. The method for controlling the frequency of piezoelectric components according to claim 23, wherein the electrodes are selectively exposed by combining aperture patterns of a plurality of said pattern boards.

25. The method for controlling the frequency of piezoelectric components according to claim 23, further comprising the step of linearly moving said pattern board.

26. The method for controlling the frequency of piezoelectric components according to claim 23, further comprising the step of rotationally moving said pattern board.

27. The method for controlling the frequency of piezoelectric components according to claim 23, further comprising the step of controlling the frequency of the electrodes on a column-by-column basis by arranging the electrodes on the piezoelectric substrate in a matrix arrangement including columns and rows, exposing electrodes through the aperture pattern of the pattern board and the window of the shielding board on a column-by-column basis, and removing portions of the electrodes.

28. The method for controlling the frequency of piezoelectric components according to claim 23, further comprising the step of controlling the frequency of electrodes on a column-by-column basis by arranging piezoelectric substrates having electrodes thereon in a matrix including columns and rows, exposing the electrodes formed on the piezoelectric substrates through the aperture pattern of the pattern board and through the window of the shielding board on a column-by-column basis, and removing portions of the electrodes.

29. A method for controlling the frequency of piezoelectric components comprising the steps of:

providing a plurality of piezoelectric substrates having electrodes formed on the surface thereon;

disposing on said piezoelectric substrate a pattern board having an aperture pattern for selectively exposing the electrodes formed on said piezoelectric substrate;

disposing on said pattern board a shielding board having a window for selectively exposing the aperture pattern of said pattern board;

removing portions of the electrodes formed on said piezoelectric substrate and exposed through the aperture pattern of said pattern board and through the window of said shielding board; and using a shutter for opening and closing the window on said shielding board.

30. The method for controlling the frequency of piezoelectric components according to claim 29, wherein the electrodes are selectively exposed by combining aperture patterns of a plurality of said pattern boards.

31. The method for controlling the frequency of piezoelectric components according to claim 29, further comprising the step of linearly moving said pattern board.

32. The method for controlling the frequency of piezoelectric components according to claim 29, further comprising the step of rotationally moving said pattern board.

33. The method for controlling the frequency of piezoelectric components according to claim 29, further comprising the step of controlling the frequency of the electrodes on a column-by-column basis by arranging the electrodes on the piezoelectric substrate in a matrix arrangement including columns and rows, exposing electrodes through the aperture pattern of the pattern board and the window of the shielding board on a column-by-column basis, and removing portions of the electrodes.

34. The method for controlling the frequency of piezoelectric components according to claim 29, further comprising the step of controlling the frequency of the electrodes on a column-by-column basis by arranging piezoelectric substrates having electrodes thereon in a matrix including columns and rows, exposing the electrodes formed on the piezoelectric substrates through the aperture pattern of the pattern board and through the window of the shielding beard on a column-by-column basis, and removing portions of the electrodes.

35. A method for controlling the frequency of piezoelectric components comprising the steps of:

provigin a plurality of piezoelectric substrates having electrodes formed on the surface thereon;

disposing on said piezoelectric substrate a pattern board having an aperture pattern for selectively exposing the electrodes formed on said piezoelectric substrate;

disposing on said pattern board a shielding board having a window for selectively exposing the aperture pattern of said pattern board;

applying a frequency control substance on the electrodes formed on said piezoelectric substrate and exposed through the aperture pattern of said pattern board and through the window of said shielding board; and using a shutter for opening and closing the window on said shielding board.

36. The method for controlling the frequency of piezoelectric components according to claim 35, wherein the electrodes are selectively exposed by combining aperture patterns of a plurality of said pattern boards.

37. The method for controlling the frequency of piezoelectric components according to claim 35, further comprising the step of linearly moving said pattern board.

38. The method for controlling the frequency of piezoelectric components according to claim 35, further comprising the step of rotationally moving said pattern board.

39. The method for controlling the frequency of piezoelectric components according to claim 35, further comprising the step of controlling the frequency of the electrodes on a column-by-column basis by arranging the electrodes on the piezoelectric substrate in a matrix arrangement including columns and rows, exposing electrodes through the aperture pattern of the pattern board and the window of the shielding board on a column-by-column basis, and removing portions of the electrodes.

40. The method for controlling the frequency of piezoelectric components according to claim 35, further comprising the step of controlling the frequency of the electrodes on a column-by-column basis by arranging piezoelectric substrates having electrodes thereon in a matrix including columns and rows, exposing the electrodes formed on the piezoelectric substrates through the aperture pattern of the pattern board and through the window of the shielding board on a column-by-column basis, and removing portions of the electrodes.

* * * * *